(12) United States Patent
Murao

(10) Patent No.: US 6,512,995 B2
(45) Date of Patent: Jan. 28, 2003

(54) SHAPE ANALYSIS, DIFFERENCE DETECTION, AND SEARCH FOR THREE-DIMENSIONAL MODELS

(75) Inventor: Takaaki Murao, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 09/839,088

(22) Filed: Apr. 20, 2001

(65) Prior Publication Data

US 2002/0004710 A1 Jan. 10, 2002

(30) Foreign Application Priority Data

Apr. 20, 2000 (JP) .......................................... 2000-120085

(51) Int. Cl.⁷ ................................................. G01B 3/22
(52) U.S. Cl. ....................... 702/167; 345/418; 345/419; 345/420; 345/441
(58) Field of Search ............................ 702/167; 345/810, 345/840, 841, 648, 630, 418, 419, 440, 441, 420; 382/303, 308, 302, 205, 154

(56) References Cited

U.S. PATENT DOCUMENTS 4,546,978 A * 10/1985 David ........................ 273/146
5,594,559 A * 1/1997 Sato et al. .................... 359/11

FOREIGN PATENT DOCUMENTS

DE 0406430 A1 * 9/1991

\* cited by examiner

Primary Examiner—John S. Hilten
Assistant Examiner—Hien Vo
(74) Attorney, Agent, or Firm—Louis P. Herzberg

(57) ABSTRACT

Through comparison of electronic shape data for parts, the invention automatically detects a difference in shapes of products due to the design change, and/or searches for a product that is similar in shape. A shape analysis system comprises: an analysis tree node generator; a neighbor graph generator, for creating an edge between the nodes that are generated by the analysis tree node generator and that are geometrically adjacent, so as to produce a neighbor graph; and an analysis tree generator, for merging nodes in the neighbor graph that are generated by the neighbor graph generator and that are connected by the edge, for generating a new node in correlation with a 3d-shape that encloses patches included in the merged nodes and a shape analysis tree wherein the node acquired by merging is defined as a parent node and the other nodes, before being merged, are defined as child nodes.

28 Claims, 23 Drawing Sheets

SHAPE ANALYSIS, DIFFERENCE DETECTION, AND SEARCH FOR THREE-DIMENSIONAL MODELS

FIELD OF THE INVENTION

The present invention relates to a shape analysis system for analyzing shape data for an electronic product, and for comparing the shapes of multiple products or for searching for a product having a similar shape.

BACKGROUND ART

At the present, the general rule in manufacturing circles is for a variety of information entries for a product to be electronically stored and managed in a database. In addition, such a database is also employed for a product for the electronic management of detailed shape information, that is, shape data, for a solid model or a surface model (hereinafter collectively referred to as a solid/surface model), and the configuration of the product's parts.

In the manufacturing business, PDM (Product Data Management) or VPDM (Visual Product Data Management) is employed for the management of the solid/surface models of products. However, before such product data can be registered in a system, management of a solid/surface model is the personal responsibility of a designer working in a design department. Therefore, the updating of the data that accompanies a design change must be performed manually by the designer.

Generally, a plurality of departments, such as a design department and a manufacturing department, are involved in the development of a product. Therefore, before product data for a specific product are stored in a PDM or VPDM database, the data may scattered among the databases used by the respective departments. Especially when a different CAD system is employed for the design of a machine to fill a predetermined job order for another, nonaffiliated company, the product data tends to be distributed among several databases. In this case, the updating of data in a specific department must be synchronized with the updating of like data stored in the databases of other departments. Conventionally, this updating operation has also been a manual activity.

Further, in the manufacturing business the effective re-use of old design data is of prime importance when a design job is undertaken.

Therefore, a management method using parts numbers is appropriate for standard parts, a set of which is standardized to a degree and can be systematically sorted using part numbers. Since a systematic management process can be implemented using parts numbers, appropriate parts can be easily selected when old design data are to be used for a design operation.

However, the systematic management of part numbers is difficult when there are nonstandard parts that have been derived from standard parts, as needed, or that have been newly designed. Therefore, even when a database using a solid model or a surface model is employed to manage parts, such as nonstandard parts that are not systematically managed, the updating of databases and data adjustments tend to be delayed. Therefore, when old design data for nonstandard parts are employed in a design process, an appropriate part can not easily be located. And as a result, a vicious cycle has arisen, in which each interested designer strives to fashion a new part to reduce the labor required to cull a desired part from among those intended for old products, and accordingly, there is an increase in the types of nonstandard parts that are available.

PROBLEMS TO BE SOLVED BY THE INVENTION

As is described above, for electronic product management in the manufacturing business, conventionally, an updating operation that includes the storage in a database of detailed changes applied during a design process, and the synchronized updating of like data in multiple databases are manually performed, so that an artificial erroneous operation may be result.

In the manufacturing business, especially when cooperative work is engaged in by an upstream department and a downstream department, if an erroneous operation for the preparation or the changing of a solid/surface model used in common occurs in the upstream department, enormous damage may occur. As an example of this phenomenon, if a die is ordered based on a solid/surface model that has not yet been updated, during the assembly process, parts can collide with each other, so that another die must be ordered based on the updated solid/surface model.

In order to automatically update data in a database in accordance with the generation of or a change in a solid/surface model, two solid/surface models must be compared with each other and any difference between them must be detected. While there are several conventional methods for automatically performing or supporting a detection process, with all of these methods, problems have arisen.

As one method, models to be compared are superimposed on a display by using a three-dimensional shape editing function, such as a machine CAD system, and detection of a difference is supported visually. In this case, using a method for employing a common z-buffer for rendering, an interference stripe occurs on superimposed faces, so that when interference strips are used it is difficult to identity a slight difference. Furthermore, since this method is generally carried out by a display engine using z-buffer hardware, it is also difficult for a difference to be automatically extracted using software.

A difference in the two models can be theoretically found by using a ray-tracing function. However, the cost for one rendering performance is high, and to automatically extract the difference between models, for superimposed models, rendering must be performed in various directions, so that there is considerable deterioration of processing efficiency.

As another method, patch division is searched for by using topological information for models generated by the machine CAD system, and a difference in the two models is obtained. However, in actuality, patch subdivision is used to define a shape that occurs when a model is modified, when a pertinent model is divided in order to concentrate on the processing for a model, or when format conversion is performed. In addition, since such an operation would be based on trial and error results provided by the performance of many procedures, it would be impossible to acquire, from among the patch divisions performed to obtain a final model, a division accompanied by a final shape change merely by performing an examination to determine the presence/absence of patch division.

Furthermore, if during the division process entries are not recorded in a log, complicated graphs must be compared to detect the patches that have been divided and to correlate patches before and after their division. Thus, the calculation costs would be increased.

Further, to compare a set of patches that, like IGES (Initial Graphic Exchange Specification), which is one of the file formats used for the exchange of graphic data by different machine CAD systems, are defined at random could, in the worst case, require that a round robin comparison of patches and patch combinations be performed, and the enormous number of procedures that this would entail would render the method unrealistic.

Since an extremely complicated operation is also required to maintain an operating log, this too is not realistic. That is, since as is described above an actual trial and error operation requires the performance of many procedures, a huge number of operating log entries would be accumulated, even for a small change. Further, to carry out the above method, a machine CAD system would have to be changed, and when multiple models derived from the same model are compared, comparisons with the original model would also have to be made.

Another method for detecting a difference in models involves the performance of calculations for a set. However, for this, a high cost is incurred for the calculation of a set of differences for complicated shapes, and in some cases, such calculations can not be completed within a promised time.

Further, for a product such as a nonstandard part that is not easy to be systematically managed, the updating of a database and the adjustment of data tend to be delayed, and design data produced in the past can not effectively be employed. Therefore, a technique is needed for the performance of comparisons of electronic shape data for products, for the immediate updating of the data in accordance with design changes, and for the mechanical search of old design data to find a product that has a shape that is similar to that of a necessary part, i.e., a product that can be re-used.

Conventionally, while a three-dimensional shape search technique for this operation is available, its function is not satisfactory.

Assume a search is performed for "a hose clip with which two 8 φ hoses can be clipped together". In this case, a search is performed under conditions wherein geometrical information consists of "8 φ" and topological information consists of "two hoses", i.e., two or more holes. However, since the conventional technique for performing a search to find a similar three-dimensional shape does not employ any geometrical information, a search can not be performed for which both topological similarity and geometrical similarity are used.

Further, assume a search is performed for "a part for which the size of a predetermined portion is equal to or larger than 60 mm and equal to or smaller than 80 mm" by using for the search for the part a reference model shape. The conventional technique used for performing a search for a like shape is based only on geometrical information and can not cope with a search when restrictive geometrical conditions or restrictive topological conditions are applied for a specific portion of a model that serves as a search key.

In addition, when a search is made for a "table" in a database, better results can be expected from a search based on topological information, such as "an object having four legs at the corners of a plate", rather than from a search based on the geometrical information for a typical table. However, since the conventional technique for searching for a similar three-dimensional shape employs only geometrical information, a search based on topological information can not be performed.

SUMMARY OF THE INVENTION

To resolve the above conventional technical shortcomings, for parts, it is one aspect of the present invention to automatically compare electronic shape data stored in databases and to detect differences. By doing this, data can be automatically and immediately updated in consonance with any changes that are applied to a design.

It is another aspect of the present invention to compare electronic shape data for parts and to automatically detect, using design data acquired the past, a product that is similar in shape to a required product.

Such a search for a similar shape can be carried out based not only on geometrical information but also on topological information.

BRIEF DESCRIPTION OF THE DRAWINGS

These and other objects, features, and advantages of the present invention will become apparent upon further consideration of the following detailed description of the invention when read in conjunction with the drawing figures, in which.

DESCRIPTION OF THE SYMBOLS

Figure 1:
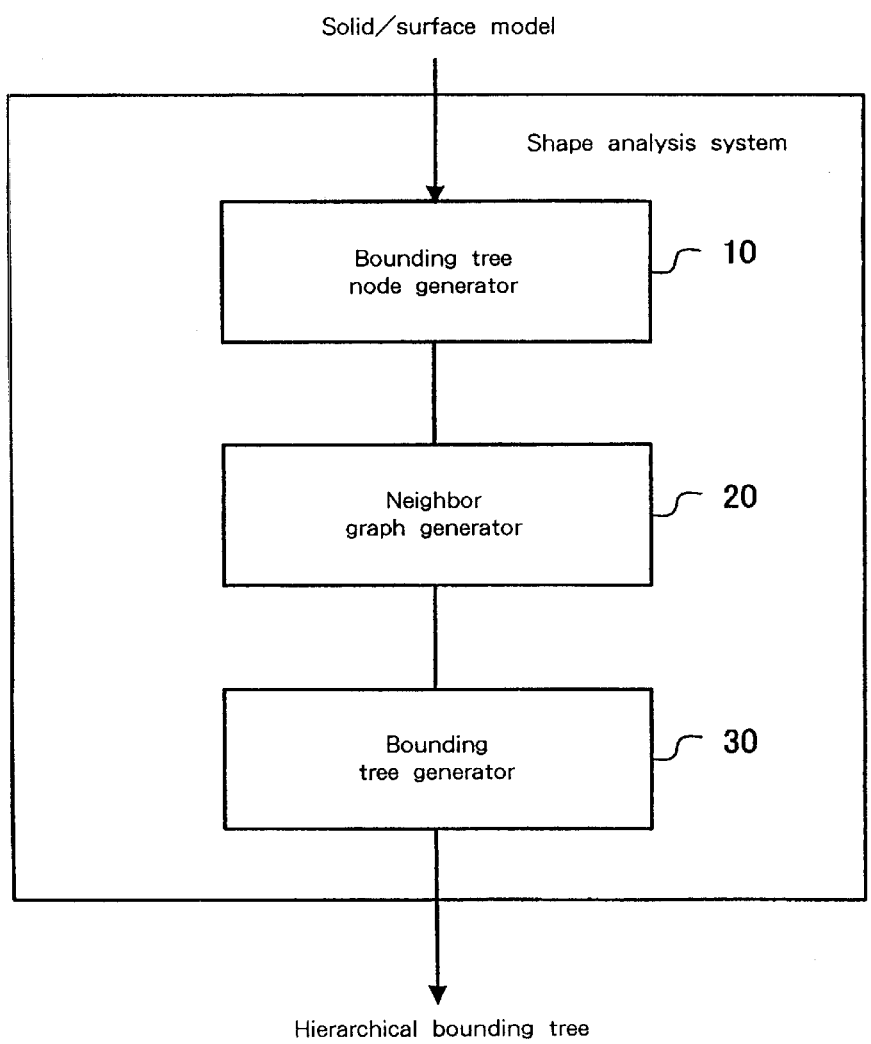
FIG. 1 is a diagram for explaining the general configuration of a shape analysis system according to a first embodiment of the present invention.

- 10: Bounding tree node generator
- 20: Neighbor graph generator
- 30: Bounding tree generator
- 40: Difference list generator
- 50: Restrictive condition addition unit
- 60: Similarity calculator
- 70: Search result output unit
- 80: Database.

DESCRIPTION OF THE INVENTION

To achieve the above aspects, according to the present invention, the following shape analysis system, which analyzes a three-dimensional shape model, is implemented. Specifically, a shape analysis system comprises: an analysis tree node generator, for generating, for each patch forming a three-dimensional shape model, a simple $3d$-shape that encloses the patch, and for generating, for a shape analysis tree, a node that corresponds to the simple $3d$-shape; a neighbor graph generator, for generating an edge between the nodes that are generated by the analysis tree node generator and that are geometrically adjacent, so as to produce a neighbor graph; and an analysis tree generator, for merging, based on a condition for first merging nodes wherein the shape of the patch is continuous, nodes in the neighbor graph that is are generated by the neighbor graph generator and that are connected by the edge, for generating a new node in correlation with a new simple $3d$-shape that encloses patches included in the merged nodes, and for generating a shape analysis tree wherein the new node acquired by merging is defined as a parent node and the other nodes, before being merged, are defined as child nodes.

With this configuration, an analysis tree can be generated while the structures of patches for a three-dimensional shape model can be reflected by the tree. Thus, when the analysis tree is employed, it is easy to detect small differences or design changes that would be difficult to identify simply by visually examining the $3d$-shape of a model, and to search for a similar model.

In this case, the simple $3d$-shape is a frame that is used to abstract the patches of a three-dimensional shape model. Generally, a parallelopiped bounding box is employed as a simple $3d$-shape, and a $3d$-shape having another simple shape, such as a sphere or a cylinder, may be employed.

The analysis tree node generator receives each path for the three-dimensional shape model, generates, for the patch, a simple $3d$-shape that encloses the object of the patch, and generates, in correlation with the simple $3d$-shape, a node that includes information concerning the size of the simple $3d$-shape and information concerning the continuity of the surfaces of the object that is enclosed in the simple $3d$-shape.

The continuity of the faces of the object indicates whether the surfaces of the object of a predetermined patch (the portion corresponding to a patch in the three-dimensional shape model) are continued using a flat plane or a curved plane. The curvature of each surface or the distribution of normal vectors can be employed as information concerning the continuity of the surfaces. And further, the continuity of the surfaces of the object can be determined relative to the surfaces at multiple adjacent patches.

As for the nodes that are connected by the edge in the neighbor graph, which is generated by the neighbor graph generator and which reflects the continuity of the shape of the patch, the analysis tree generator merges the nodes based on information, included in the nodes, that concerns the continuity of the surfaces of the object, and generates a new node as well as a partial shape analysis tree that employs the new node. Then, based on information concerning the size of a simple $3d$-shape that corresponds to the new node and other nodes that have not been merged and based on the information that concerns the continuity of the surfaces of the object, the analysis tree generator merges the new node and the other nodes until all of the nodes in the neighbor graph are merged and form a single simple $3d$-shape.

To merge nodes based on the information concerning the size of a simple $3d$-shape, for example, arbitrary simple $3d$-shapes that are connected by the edge in the neighbor graph are merged in order beginning with the simple $3d$-shapes for which an obtained $3d$-shape would be the smallest.

According to the present invention, a shape analysis system for a three-dimensional model comprises: a node generator, for generating, for each patch constituting a three-dimensional shape model, a node that, for the path, stores geometrical information concerning the three-dimensional shape model; a neighbor graph generator, for employing the node obtained by the analysis tree node generator to generate a neighbor graph in which the geometrically adjacent relationship in the three-dimensional shape model is reflected; and an analysis tree generator, for employing the neighbor graph produced by the neighbor graph generator to merge nodes for which corresponding patches are adjacent in the three-dimensional shape model, and for generating a shape analysis tree wherein a new node obtained by merging is defined as a parent node and the other nodes before being merged are defined as child nodes.

According to the present invention, the following difference detection system for a there-dimensional model is provided. Specifically, a difference detection system for a three-dimensional shape model comprises: an input unit, for entering tree structures, each of which includes a node that stores geometrical information for each path that constitutes the three-dimensional shape model and in each of which geometrical information for the patch is reflected; and a difference detector, for comparing the tree structures to detect differences.

With this configuration, the shapes of multiple models can be compared by using the structures of analysis trees in which the structure of the three-dimensional shape model is reflected. Thus, small differences that would be difficult to identify by visually examining the 3$d$-shape of the three-dimensional model can be easily detected. Especially when to detect differences the exchange of data is employed before and after the design of a predetermined model, the portion whereat the design is changed can be automatically detected.

The path that constitutes the three-dimensional shape model and is used as data to generate the tree structure, which is used for difference detection, can be a patch that corresponds to a data format and that does not include the topological information. Specifically, the IGES that can be output by many machine CAD systems can be employed. Since data that are compatible with the IGES can be employed, an extremely appropriate general purpose system can be provided.

The difference detector compares, beginning at the roots, the individual sub-trees of the tree structures of the shape analysis trees that correspond to multiple models in depth order, and determines whether sub-trees of the shape analysis trees, which employ corresponding nodes as roots, match. Only the sub-trees that have not been matched are compared for further depth, and nodes for which it is determined there are no matches are collected as differences for the shape analysis trees.

As a specific method, a list wherein sub-trees are correlated with ranks is prepared, and sub-trees that were matched using comparison are deleted from the list, until only the sub-trees that are not matched remain and are used to indicate differences. Whether or not sub-trees are matched can be determined by comparing the numerical values of the shapes of models that correspond to the sub-trees.

According to the present invention, a difference detection system for a three-dimensional shape model comprises: a tree structure generator, for preparing a graph, which includes a node for the storage of geometrical information for each path that constitutes the three-dimensional shape model and in which a geometrically adjacent relationship for the three-dimensional shape model is reflected, and for using the graph to generate tree structures in which the structure of the three-dimensional shape model is reflected; and a difference detector, for comparing the tree structures produced by the tree structure generator to detect differences.

According to the present invention, the following similar shape search system can be provided. Specifically, a similar shape search system comprises: a similarity calculator, for entering multiple tree structures, each of which has a node that stores geometrical information for each patch that constitutes a three-dimensional shape model and in which the structure of the three-dimensional shape model, including the geometrical information, is reflected, and for comparing the tree structures to calculate the similarity of the three-dimensional shape model; and a search result output unit, for outputting, as a search result, one of the tree structures that is obtained by the similarity calculator and that is highly similar to a tree structure for a predetermined model that constitutes a search key.

Wit this configuration, since the shapes of multiple models can be compared using tree structures that reflect the structure of the three-dimensional shape model, a model that is similar in shape to a search key model can be searched for to provide comparison results for the node and the tree structure.

The similar shape search system further comprises a restrictive condition addition unit for defining a restrictive condition for the comparison of shape analysis trees, relative to the tree structure for the predetermined model that constitutes a search key. The similarity calculator compares the tree structures while taking into account the restrictive condition that is added to the tree structure of the predetermined model by the restrictive condition addition unit.

This configuration is preferable because an especially important condition can be designated a restrictive condition and can be used to determine whether shapes are similar. A geometrical condition or a topological condition can be designated a restrictive condition, and specifically, when a condition wherein a specific surface is a curved surface or when two holes are present in a specific portion is first established, a model similar in shape to a search key model can be searched for.

The similarity calculator performs a comparison for a complete tree structure whereby a tree structure is found that fully corresponds to a tree structure in a predetermined three-dimensional shape model, which serves as a search key, and is ascertained to evidence a high similarity to the predetermined three-dimensional shape model, or performs a comparison for a sub-tree structure whereby the partial condition of a tree structure, which matches or is similar to a tree structure that serves as a search key, is ascertained to evidence a high similarity to the three-dimensional shape model.

This configuration is preferable in that, for the comparison of sub-tree structures, a model that satisfies a specific geometrical or topological condition can be searched for, without taking into account the question of whether the overall shape is similar.

According to the present invention, the following shape analysis method for a three-dimensional shape model is provided. Specifically, a shape analysis method comprises the steps of: generating, for each patch forming a three-dimensional shape model, a simple 3$d$-shape that encloses the patch, and generating, for a shape analysis tree, a node that corresponds to the simple 3$d$-shape; generating an edge between the nodes that are thus generated and that are geometrically adjacent, so as to produce a neighbor graph; and merging, based on a condition for first merging nodes wherein the shape of the patch is continuous, nodes in the neighbor graph that are connected by the edge, generating a new node in correlation with a new simple 3d-shape that encloses patches included in the merged nodes, and generating a shape analysis tree wherein the new node acquired by merging is defined as a parent node and the other nodes, before being merged, are defined as child nodes.

According to the present invention, the following difference detection method for a three-dimensional shape model is provided. Specifically, a difference detection method for a three-dimensional shape model comprises the steps of: generating tree structures, each of which includes a node that stores geometrical information for each patch that constitutes three-dimensional shape models and in each of which geometrical information for the patch is reflected; and comparing the tree structures to detect a difference in three-dimensional shape models.

With this configuration, the shapes of multiple models can be compared by using the structures of analysis trees in which the structure of the three-dimensional shape model is reflected. Thus, a difference in the shapes of models can be automatically detected.

According to the present invention, the following similar shape search method is provided. Specifically, a similar shape search method comprises the steps of: entering multiple tree structures, each of which has a node that stores geometrical information for each patch that constitutes a three-dimensional shape model and in which the structure of the three-dimensional shape model, including the geometrical information, is reflected, and comparing the tree structures to calculate the similarity of the three-dimensional shape model; and outputting, as a comparison result, one of the tree structures that is obtained by the similarity calculator and that is highly similar to a tree structure for a predetermined model that constitutes a search key.

With this configuration, since the shapes of multiple models can be compared using tree structures that reflect the structure of the three-dimensional shape model, a model that is similar in shape to a search key model can be automatically searched.

At the step of calculating the similarity, selectively performed are the steps of: performing a comparison for a complete tree structure whereby a tree structure is found that fully corresponds to a tree structure in a predetermined three-dimensional shape model, which serves as a search key, and is ascertained to evidence a high similarity to the predetermined three-dimensional shape model; and performing a comparison for a sub-tree structure whereby the partial condition of a tree structure, which matches or is similar to a tree structure that serves as a search key, is ascertained to evidence a high similarity to the three-dimensional shape model.

This configuration is preferable in that, for the comparison of sub-tree structures, a model that satisfies a specific geometrical or topological condition can be searched for, without taking into account the question of whether the overall shape is similar. Furthermore, similarity searches for a complete shape and for a partial shape can be selectively performed.

According to the present invention, the following shape analysis method for a three-dimensional shape model is provided. Specifically, a shape analysis method comprises the steps of: entering data for a model having a three-dimensional shape before and after a design is changed; analyzing the shape of the model using a tree structure that has nodes corresponding to patches constituting the models and in which the positional relationship of the patches is reflected, so that a portion wherein there has been a design change can be automatically detected; and outputting analyzation results for identifying the portion wherein the design has been changed.

This configuration is superior because, without possessing any foreknowledge that would indicate a design has been changed, a user can enter and analyze two sets of data for the same model, and a design change can be automatically detected and the changed portion identified.

On a display screen for displaying a three-dimensional shape model, a patch at the portion whereat the design has been changed is clearly designated, so that the portion wherein the design has been changed can be identified.

This configuration is preferable because the changed portion can be output and thus can be easily identified. Further, the designation means can be constituted by means that employs a different color for the display of a patch whereat a design has been changed.

According to the present invention, a storage medium is provided on which input means of a computer stores a computer-readable program that permits the computer to perform: a process for generating, for each patch forming a three-dimensional shape model, a simple 3d-shape that encloses the patch, and for generating, for a shape analysis tree, a node that corresponds to the simple 3d-shape; a process for generating an edge between the nodes that are generated by the analysis tree node generator and that are geometrically adjacent, so as to produce a neighbor graph; and a process for merging, based on a condition for first merging nodes wherein the shape of the patch is continuous, nodes in the neighbor graph that is are generated by the neighbor graph generator and that are connected by the edge, for generating a new node in correlation with a new simple 3d-shape that encloses patches included in the merged nodes, and for generating a shape analysis tree wherein the new node acquired by merging is defined as a parent node and the other nodes, before being merged, are defined as child nodes.

With this configuration, all the computers in which this program has been installed can use an analysis tree to represent the structure of a three-dimensional shape model. Further, the analysis tree can be employed to detect a difference in the shape of a model, or to search for a similar model.

According to the present invention, a program transmission apparatus comprises: storage means for storing a program that permits a computer to perform: a process for generating, for each patch forming a three-dimensional shape model, a simple 3d-shape that encloses the patch, and for generating, for a shape analysis tree, a node that corresponds to the simple 3d-shape; a process for generating an edge between the nodes that are generated by the analysis tree node generator and that are geometrically adjacent, so as to produce a neighbor graph; and a process for merging, based on a condition for first merging nodes wherein the shape of the patch is continuous, nodes in the neighbor graph that is are generated by the neighbor graph generator and that are connected by the edge, for generating a new node in correlation with a new simple 3d-shape that encloses patches included in the merged nodes, and for generating a shape analysis tree wherein the new node acquired by merging is defined as a parent node and the other nodes, before being merged, are defined as child nodes.

With this configuration, all the computers that has downloaded this program can use an analysis tree to represent the structure of a three-dimensional shape model. Further, the analysis tree can be employed to detect a difference in the shape of a model, or to search for a similar model.

Preferred Embodiments

The preferred embodiments of the present invention will now be described in detail while referring to the accompanying drawings.

According to the present invention, a hierarchical shape analysis tree (a hierarchical bounding tree: hereinafter referred to simply as a bounding tree) is generated that specifies the shape of a target product using a solid/surface model of the product. By using the obtained bounding tree, bounding trees for multiple solid/surface models can be compared to detect differences between them, or a product whose shape is similar to a search reference solid/surface model (hereinafter referred to as a reference model) can be found in a solid/surface model database.

In this invention, for a first embodiment a shape analysis system for analyzing the shape of a solid/surface model to generate a bounding tree will be explained; for a second embodiment a solid/surface model difference detection system, for employing a bounding tree to perform comparisons with bounding trees for multiple solid/surface models to detect differences in shapes, will be explained; and for a third embodiment a similar shape search system, for employing a bounding tree to determine whether among multiple solid/surface models a similarity exists, will be described.

First Embodiment

FIG. 1 is a diagram for explaining the general configuration of a shape analysis system according to the first embodiment of the present invention.

In FIG. 1, a bounding tree node generator 10 generates the nodes for a bounding tree for a solid/surface model. A neighbor graph generator 20 generates a neighbor graph using a set of nodes for the bounding tree produced by the bounding tree node generator 10. And a bounding tree generator 30 merges the nodes in the neighbor graph, prepared by the neighbor graph generator 20, to generate a bounding tree having a hierarchical structure.

With this arrangement, the bounding tree node generator 10 receives the solid/surface model of a product to be analyzed, and generates a bounding box for each of the patches that constitute the solid/surface model. The bounding tree generator 10 then generates nodes for the respective bounding boxes.

Figure 2:
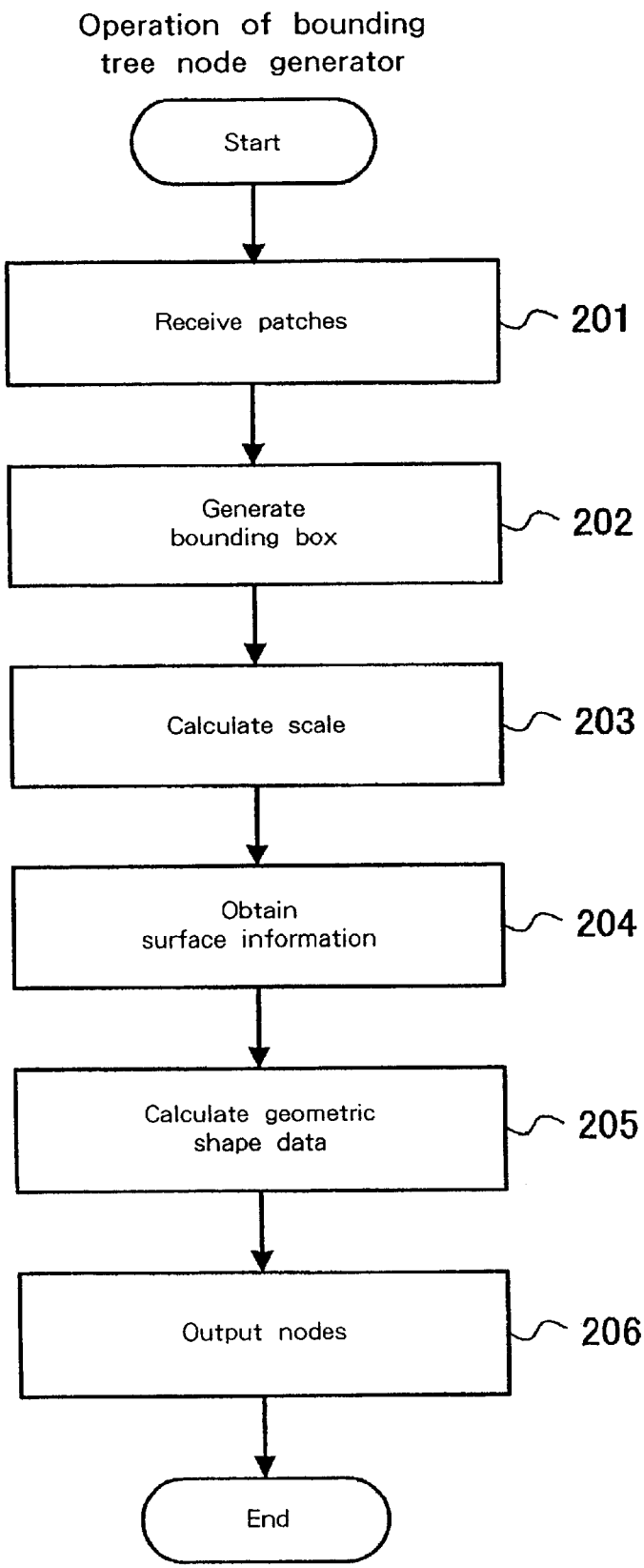
FIG. 2 is a flowchart for explaining the processing performed by a bounding tree node generator according to the first embodiment.

FIG. 2 is a flowchart for explaining the operation of the bounding tree node generator 10. In FIG. 2, first, the bounding tree node generator 10 receives patches for a solid/surface model (step 201), and generates bounding boxes that enclose the respective patches (objects) (step 202). The bounding box referred to here is a parallelopiped frame, designed to handle the abstract of a patch (an object), that encloses the patch (object). Instead of the parallelopiped bounding box, another pattern having a simple shape, such as a sphere or a cylinder, can be employed to contain the abstracts of patches. Following this, the scale of the bounding box is calculated (step 203). This scale can be represented by, for example, the diagonal length of the bounding box, and when a sphere is employed instead of the bounding box, the diameter of the sphere can be employed as the scale.

Then, information concerning the surface of the patch (object) (hereinafter referred to as surface information) is obtained (step 204). And since the information obtained here constitutes information concerning the continuity of surfaces, it is used in this embodiment to calculate curvature and the distribution of normal vectors. Thereafter, the geometrical shape data for the patch (object) are calculated (step 205). These geometrical shape data are numerical data for the geometrical characteristics of an object, and by using the numerals, the geometrical shapes of objects can be compared. Further, various methods have been proposed for obtaining the numerical data for the geometrical shape, and there is an arbitrary method that can be employed. Subsequently, a node that corresponds to the bounding box for the path is generated and output (step 206).

The node output by the bounding tree node generator 10 holds a list of patches belonging to the nodes, and various information items obtained via the process performed up to step 205, i.e., the bounding box of the patch that belongs to the local node, the scale of the local node, the surface information for the patch that belongs to the local node, and the geometrical shape data of the patch of the local node. Further, the information may be set for identifying a node that has a negative volume, such as patches distinguishing a hole, from a node that has a regular positive volume, and may be stored in the node.

For a set of nodes generated by the bounding tree node generator 10, the neighbor graph generator 20 generates an edge between geometrically adjacent nodes to prepare a neighbor graph. This processing will now be described by using an example while referring to FIGS. 3 to 5.

Figure 3:
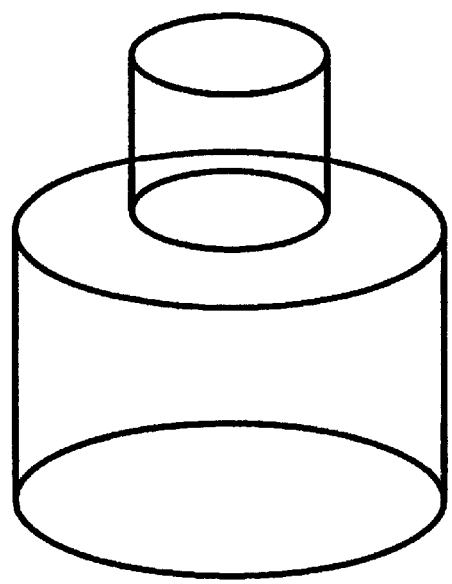
FIG. 3 is a diagram showing a surface model with a stepped hole to be analyzed in accordance with the first embodiment.

FIG. 3 is a diagram showing a surface model having a stepped hole that is to be analyzed. The stepped hole is so shaped that a small hole is formed in the bottom of a large hole (the upper face in FIG. 3).

Figure 4:
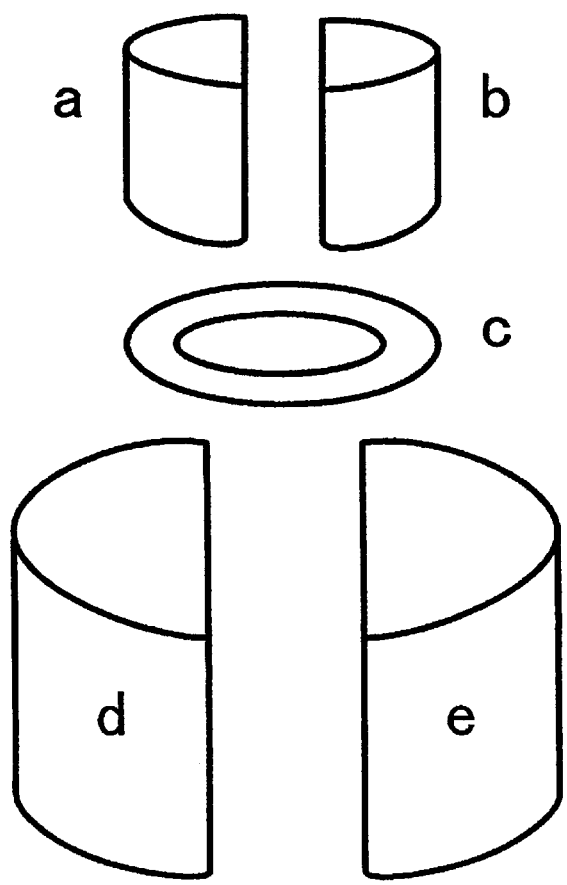
FIG. 4 is a diagram showing patches that constitute the surface model in FIG. 3.

FIG. 4 is a diagram showing patches that constitute the surface model in FIG. 3. As is shown in FIG. 4, the surface model in FIG. 3 is represented by five patches, a to e. As is apparent from FIGS. 3 and 4, the patches a and b, the patches a and c, the patches a and d, the patches b and c, the patches b and e, the patches c and d, the patches c and e, and the patches d and e are geometrically adjacent.

Figure 5:
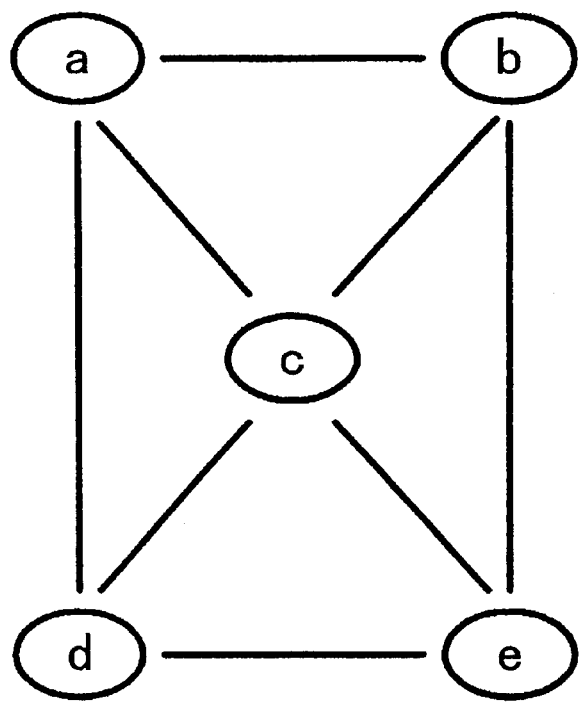
FIG. 5 is a diagram showing a neighbor graph generated from corresponding to the patches in FIG. 4.

FIG. 5 is a diagram showing a neighbor graph generated by the nodes that corresponds to the patches in FIG. 4. In FIG. 5, nodes a to e are generated for corresponding patches a to e, and edges are generated between the nodes a and b, the nodes a and c, the nodes a and d, the nodes b and c, the nodes b and e, the nodes c and d, the nodes c and e, and the nodes d and e, which are adjacent to each other.

The nodes that constitute the neighbor graph are those obtained by the bounding tree node generator 10.

The bounding tree generator 30 generates a bounding tree by using the neighbor graph produced by the neighbor graph generator 20. During the generation process, the nodes in the neighbor graph are sequentially merged in accordance with a predetermined rule. As the rule for merging the nodes, in this embodiment, the surface information and the scale obtained by the bounding tree node generator 10 are employed to perform two processes. That is, first, the portions that as a shape are continuous are merged. Then, in accordance with the size of the bounding box (conforms to the size of the patch obtained by merging the node pair) that encloses a pair of nodes that are connected by the edge in the neighbor graph, the merging of nodes is continued until all the nodes are united into one node. When the bounding boxes obtained by merging multiple node pairs are the same, or when another node is enclosed in the bounding box obtained by merging a node pair, these nodes are merged at the same time. During the node merging process, a tree structure is prepared wherein before being merged the nodes are defined as child nodes, and the node obtained after the merging is performed is defined as a parent node. That is, the enclosure relationship of the individual merged portions is carried over to the parental relationship in the tree structure. As a result, when the nodes are finally united, the tree structures are also united to obtain a single tree structure.

It should be noted that, when the nodes are merged, new bounding boxes are generated that enclose all the patches of the respective merged nodes, and the nodes are correlated with the new bounding boxes. A patch that corresponds to a new node is employed to calculate the surface information and the geometrical shape data, which, together with the bounding box, are stored as attributes for the node.

The bounding tree generator 30 examines the layers of brotherhood nodes (nodes having the same parent) in the obtained bounding tree, and finds a layer that includes a node whose patch in the solid/surface model is not adjacent to the patch that belongs to another brotherhood node. Then, the parent node of the pertinent layer is deleted, and the brotherhood nodes are moved to the layer immediately above (i.e., the layer of the deleted parent node). When the bounding tree is so modified that each brotherhood node in the bounding tree is adjacent to another brotherhood node, the efficiency of the comparison can be further increased.

Figure 6:
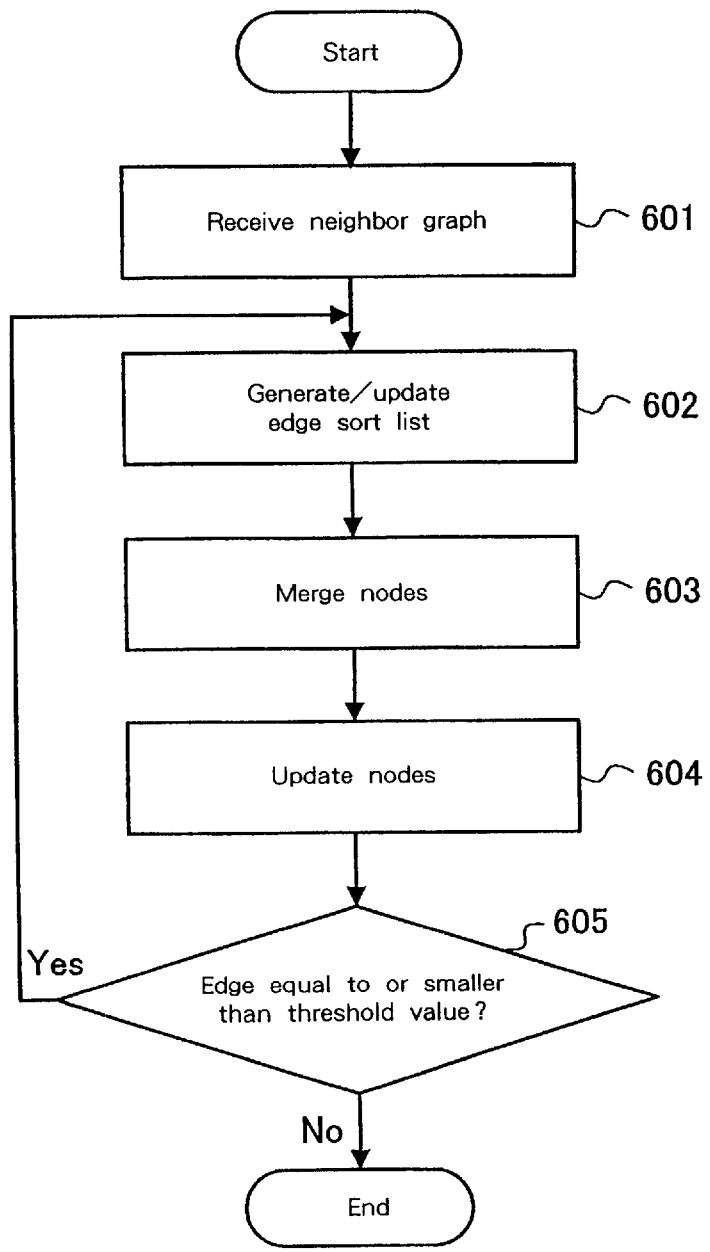
FIG. 6 is a flowchart for explaining the processing performed by a bounding tree generator according to the first embodiment, for employing surface information to merge nodes and for generating a bounding tree.

FIG. 6 is a flowchart for explaining the operation of the bounding tree generator 30 when it merges nodes using surface information, and the generation of a bounding tree.

In FIG. 6, first, the bounding tree generator 30 receives the neighbor graph from the neighbor graph generator 20 (step 601). The edges in the neighbor graph are sorted based on the distance for the surface information between the nodes located at the two ends of each edge, and an edge sort list is generated (step 602). The distance for the surface information is an approximate value that is obtained by employing, as a viewpoint, the continuity of the surfaces in the surface information as it relates to the nodes at the two ends of the edge. For example, a small value is obtained as a distance between the nodes that constitute a smoothly continuous surface, such as the side face of a cylinder, and a large value is obtained as a distance between the nodes that constitute faces, such as those of a cube, that are folded over and connected together.

According to the example for the curvature and the distribution of normal vectors in this embodiment, when the values of the curvature and the distribution of normal vectors are near, the distance provided as the surface information is short. For example, in the set of patches in FIG. 4, patches a and b at the two ends of the edge (ab) are shaped by dividing one cylinder into two, and the curvatures and the distributions of normal vectors for the patches are continuous. Thus, the distance provided as the surface information between the nodes a and b that correspond to the patches a and b in FIG. 5 is the shortest. The distance provided as the surface information represents the continuity of the surfaces of the patches that belong to the corresponding nodes.

While the edge sort list is referred to, the nodes at the ends of each edge are merged in order, beginning with the edge having the shortest distance that is provided as surface information (step 603). In the examples in FIGS. 4 and 5, the nodes a and b are merged. Similarly, since the distribution of the normal vectors as surface information is continuous for the nodes d and e, these nodes are merged. In the following explanation, a new node obtained by merging the nodes a and b is represented as a node {ab}. The node {ab} is correlated with a new bounding box that encloses the patches a and b.

At this time, a tree structure (a sub-bounding tree) is prepared wherein the nodes that are merged are defined as child nodes and a node that is obtained by merging is defined as a parent node. Provided in the examples in FIGS. 4 and 5 are a tree structure, wherein the nodes a and b are child nodes and the node {ab} is a parent node, and a tree structure, wherein the nodes d and e are child nodes and the node {de} is a parent node.

When multiple edges having equal distances are provided as surface information, and when the edges are connected to each other in the neighbor graph, all the nodes connected by the edges are merged at the same time. That is, when there are three nodes p, q and r, and when the distance provided as the surface information between the edges (p, q) is equal to the distance provided as the surface information between the edges (q, r), the nodes p, q and r are merged at the same time. The connection relationship means that multiple edges have the same node.

The node for the neighbor graph is updated in accordance with the results provided by the node merging process at step 603 (step 604). At this time, the same information as is provided by the various information entries that are added to the node by the bounding tree node generator 10, i.e., the list of the patches that belong to the respective nodes, the bounding box of the patch for the local node, the scale of the local node, the surface information for the patch of the local node and the geometrical shape data for the patch of the local node, is added to the a new node that is obtained by merging the nodes.

Thereafter, a check is performed to determine whether there is an unprocessed edge, along which the distance between the nodes provided as the surface information is equal to or smaller than a predetermined threshold value (step 605). If there is such an edge, program control returns to step 602, and the edge sort list is updated based on the new neighbor graph wherein the nodes are updated at step 604 (step 602). The node merging process and the updating process at steps 603 and 604 are then repeated. Here, while the threshold value can be dynamically set in accordance with the product to be analyzed and its solid/surface model, a comparatively small value should be set while taking into account the fact that the distance in the surface information represents the continuity of the surfaces of the patches.

Figure 7:
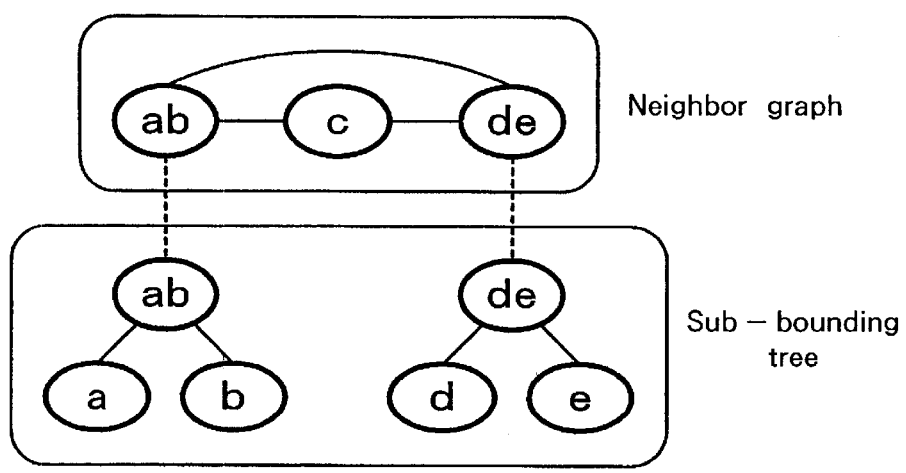
FIG. 7 is a diagram showing a neighbor graph obtained by merging and updating the nodes, and a bounding tree that is accordingly generated.

FIG. 7 is a diagram showing a neighbor graph, obtained by the node merging and updating processes performed at steps 603 and 604, and a bounding tree that is accordingly generated. In the neighbor graph in FIG. 7, the nodes a and b are merged to obtain the node {ab}, and the nodes d and e are merged to obtain the node {de}. Further, a sub-bounding tree where the node {ab} is a parent and the nodes a and b are children, and a sub-bounding tree where the node {de} is a parent and the nodes d and e are children are generated. Since the distances between the node {ab}, the node c and the node {de} in the surface information are greater than the threshold value, in this process these nodes are not merged.

When the node merging and updating process has been performed for all the edges for which the distance between the nodes in the surface information is equal to or smaller than the threshold value (No at step 605), program control uses the scale to shift to the bounding tree generation process, When the distances between the nodes in the surface information for all the edges are equal to or smaller than the threshold value, all the nodes are finally united into one node, and a single bounding tree is generated that employs the obtained node as a parent. Therefore, the bounding tree is output without using the scale, which will be described later, to shift to the bounding tree generation process. Thereafter, the operation of the bounding tree generator 30 is terminated.

Figure 8:
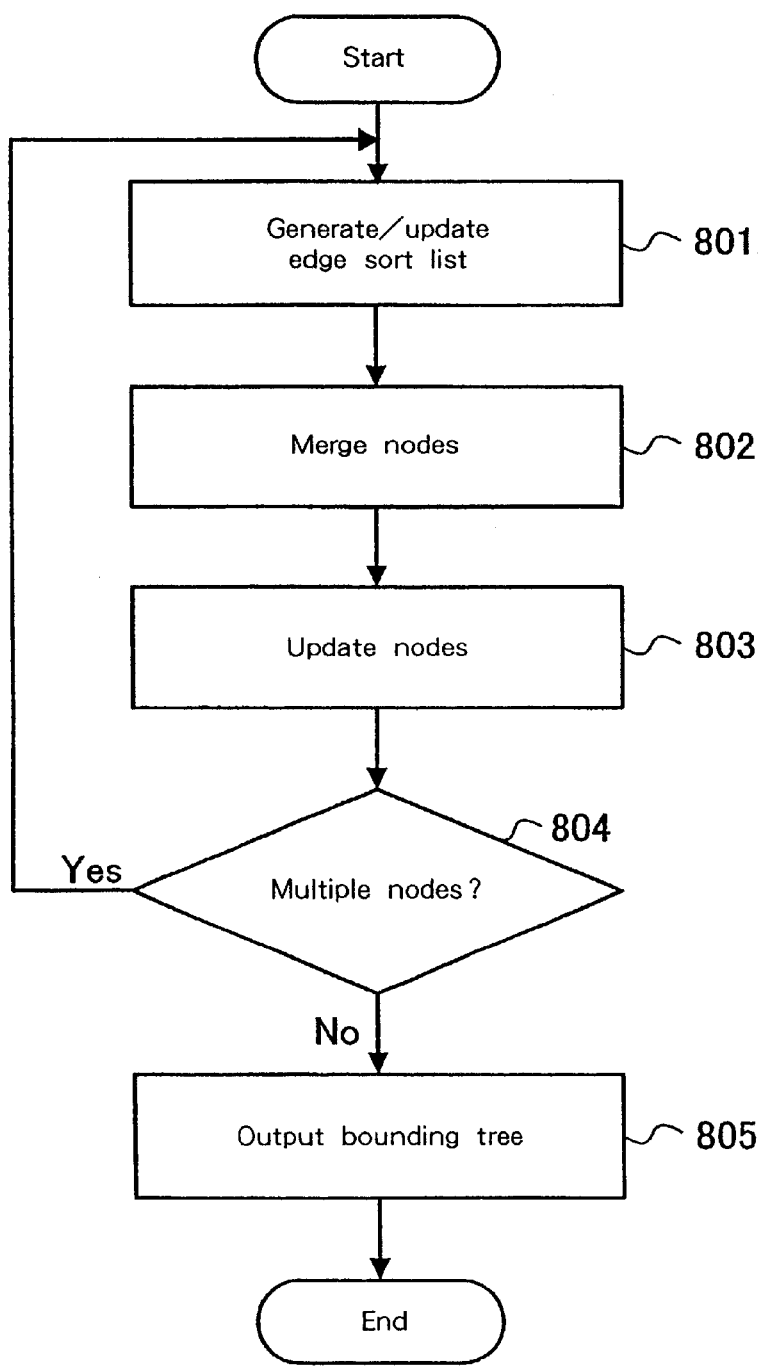
FIG. 8 is a flowchart for explaining the processing performed by the bounding tree generator according to the embodiment, for merging nodes using a scale and for generating a bounding tree.

FIG. 8 is a flowchart for explaining the operation of the bounding tree generator 30 when merging nodes using a scale and when generating a bounding tree.

In FIG. 8, first, for a new neighbor graph that is finally obtained by using the surface information to merge the nodes in the above described bounding tree generation process, the bounding tree generator 30 generates a new edge sort list based on the scale for each pair of nodes that are connected by an edge in the new neighbor graph, i.e., the sizes of the bounding boxes for the node pairs (step 801). In this embodiment, in the edge sort list, the bounding boxes are sorted beginning with the smallest bounding box that encloses nodes located at the two ends of an edge. It should be noted that before the node pair located at the ends of an edge are merged, the bounding box is generated so that it encloses all the patches (objects) belonging to the pertinent node pair. A diagonal length of the bounding box of the node pair is defined as the size of the bounding box, as well as the scales of the nodes obtained by the bounding tree generator 10. When there are multiple such edges where the scales of the nodes at either end of each of the edges are the same and when these edges are connected together, all the nodes located at the ends of the edges are merged at the same time.

While referring to the edge sort list, the nodes located at opposite ends of each of the edges are sequentially merged, beginning with the edge that connects the node pair having the smallest bounding box (step 802). In the example in FIGS. 4 to 7, the sizes of the bounding boxes are increased in the order represented by the paired nodes c and {ab} and the paired nodes c and {de}. Therefore, the edge (ab, c) that connects the nodes {ab} and c is employed to merge these nodes. Thus, the tree structure is generated wherein the nodes {ab} and c are children and the node {abc} is a parent. Next, the nodes in the neighbor graph are updated in accordance with the node merging process at step 802 (step 803).

Following this, a check is performed to determine whether there are multiple nodes in the neighbor graph (step 804). If there are multiple nodes in the neighbor graph, program control returns to step 801 whereat the edge sort list is updated based on a new neighbor graph wherein the nodes were updated at step 803. Then, the node merging and updating at steps 802 and 803 are repeated. For example, since the pair of nodes {abc} and {de} still remains when the node {abc} is generated for the neighbor graph in FIG. 7, the node merging and updating processes are repeated. As a result, the sub-tree structures are united into a single bounding tree wherein the node {abcde} is a parent node, and in the neighbor graph only the node {abcde} is included as an element.

Figure 9:
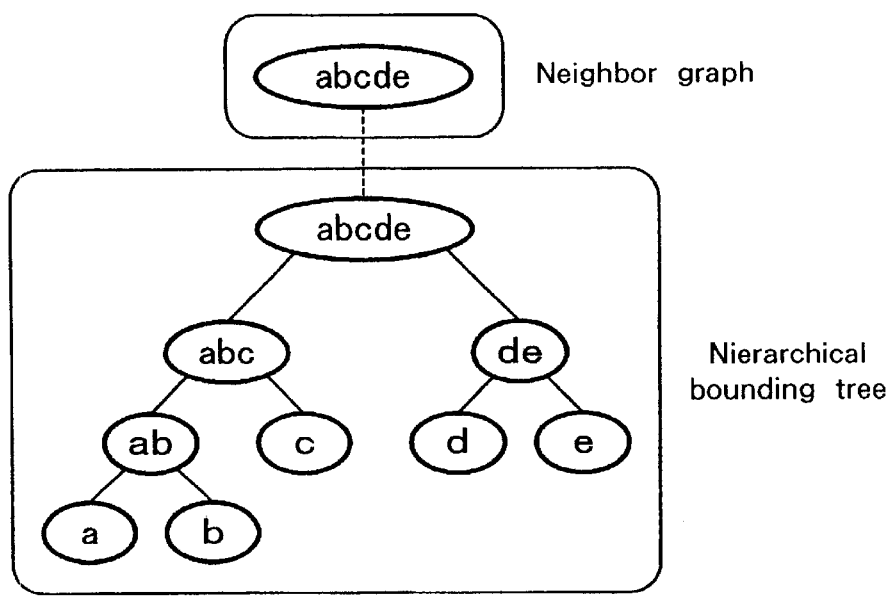
FIG. 9 is a diagram showing a neighbor graph and a bounding tree that are finally obtained.

FIG. 9 is a diagram showing the neighbor graph and the hierarchical bounding tree that are thus obtained. When only one node is present in the neighbor graph, as is shown in FIG. 9 (No at step 804), the bounding tree is output (step 805), and the processing performed by the bounding tree generator 30 is thereafter terminated.

Through the above described processing performed by the bounding tree node generator 10, the neighbor graph generator 20 and the bounding tree generator 30, using a solid/surface model a hierarchical bounding tree is generated that specifies the shape of a product. The hierarchical bounding tree is then employed to detect a difference in the shapes of multiple solid/surface models, or to determine the similarities between multiple solid/surface models.

Second Embodiment

Figure 10:
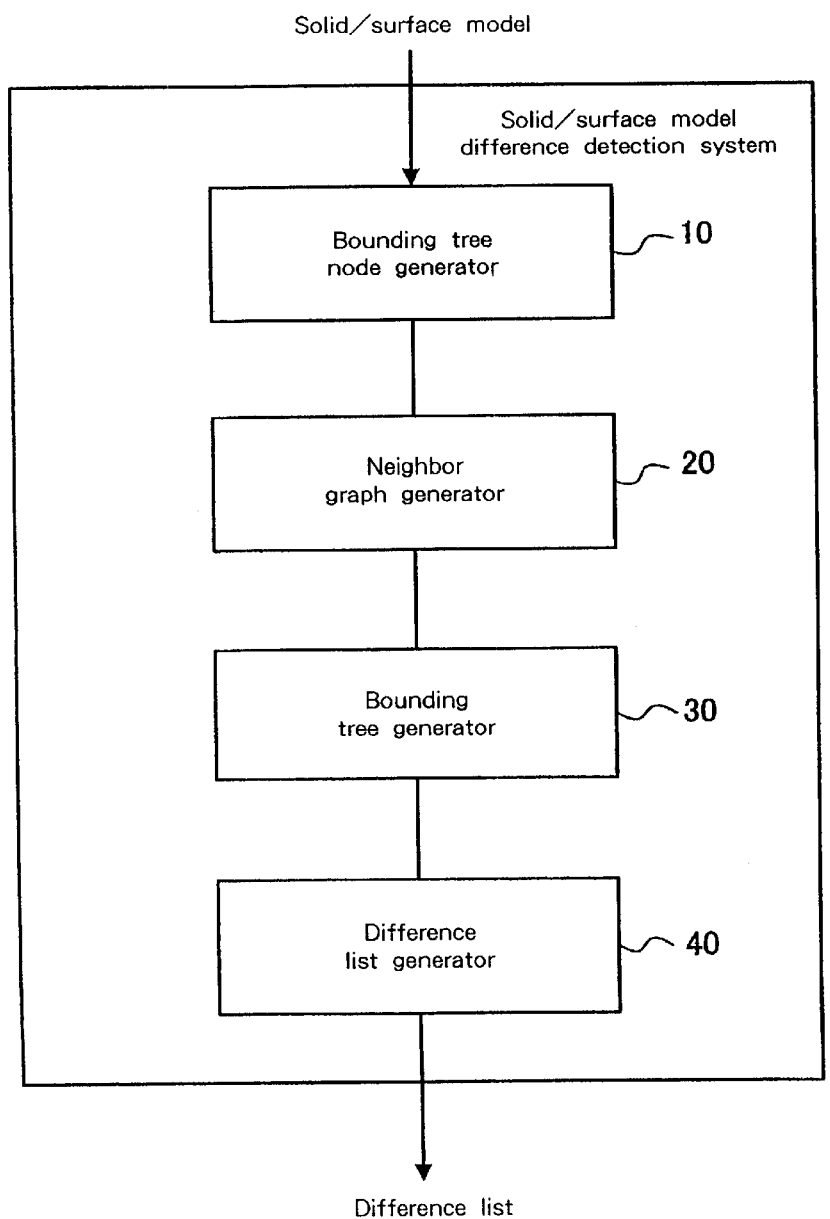
FIG. 10 is a diagram for explaining the general configuration of a solid/surface model difference detection system according to a second embodiment of the present invention.

FIG. 10 is a diagram for explaining the general configuration of a solid/surface model difference detection system according to a second embodiment of the present invention.

Figure 11:
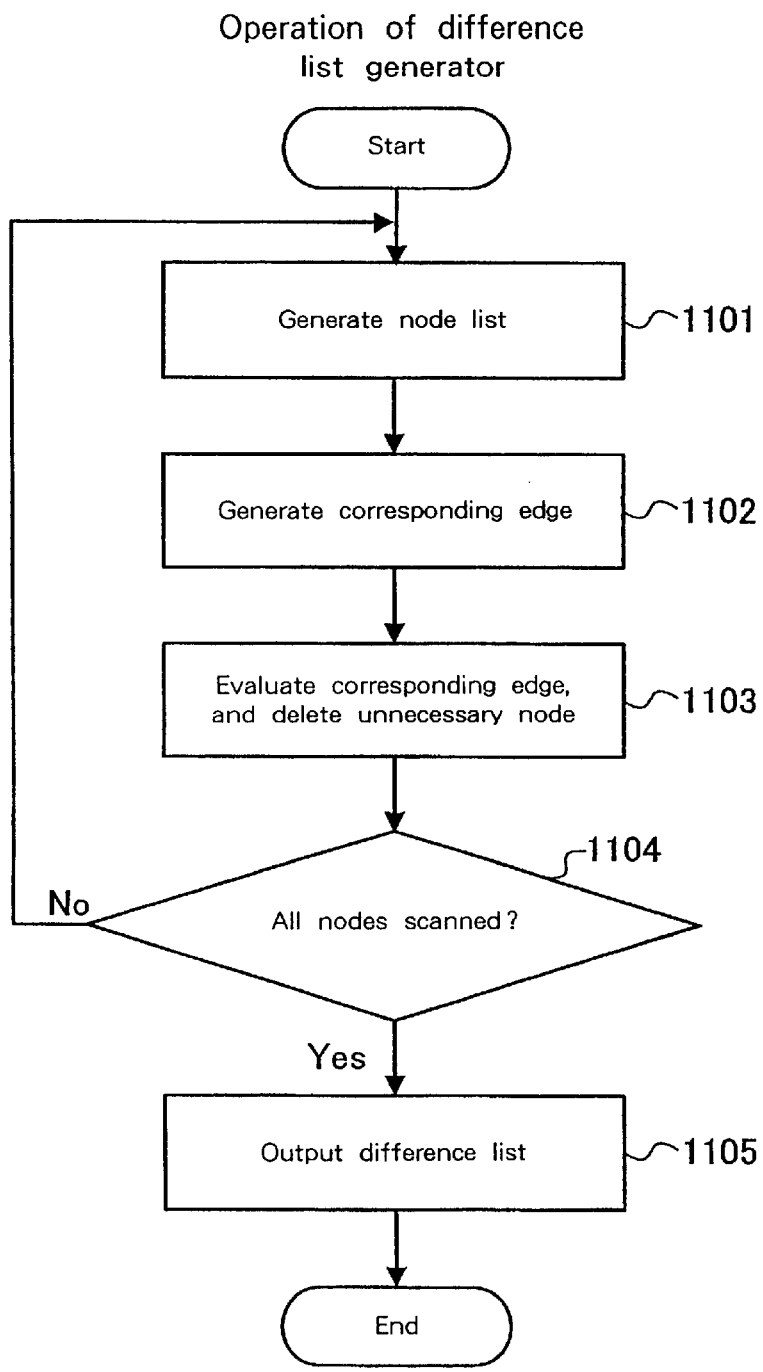
FIG. 11 is a flowchart for explaining the processing performed by a difference list generator according to the second embodiment.

In FIG. 10, a bounding tree node generator 10, a neighbor graph generator 20 and a bounding tree generator 30 are the same as those in the shape analysis system for the first embodiment in FIG. 1. In addition, a difference list generator 40 is provided that detects a difference between bounding trees generated for two solid/surface models by the bounding tree node generator 10, the neighbor graph generator 20 and the bounding tree generator 30. That is, the solid/surface model difference detection system in this embodiment is so designed that the difference list generator 40 is added to the shape analysis system for the first embodiment in FIG. 1. Therefore, the same reference numerals are used to denote the bounding tree node generator 10, the neighbor graph generator 20 and the bounding tree generator 30, and no further explanation for them will be given. The difference list generator 40 receives two bounding trees that are generated for two solid/surface models, and to detect a difference, compares these two bounding trees. FIG. 11 is a flowchart for explaining the operation of the difference list generator 40.

In FIG. 11, the difference list generator 40 generates two node lists by traversing the two bounding trees for each level, i.e., in the Breadth First search manner (step 1101). Nodes that are detected by traversing the two bounding trees are included in the respective node lists. In the following explanation, the node lists are represented as node list A and node list B. Since the bounding tree is traversed at each level, the nodes at the same level of the two bounding trees are extracted at the same time. A specific example of the preparation of a node list will be described later.

The edges that connect the nodes in node list A to the nodes in node list B are generated based on the geometrical shape data for the corresponding nodes (step 1102). The edges are sorted into matched edges and similar edges in accordance with the contents of the nodes that are connected by the corresponding edges. The edge type and whether an edge should be generated between specific nodes are determined by a predetermined threshold value for the distance that is calculated using the geometrical shape data for the individual nodes of the bounding tree. For example, when the geometrical shape data for two target nodes are matched, the edge type is defined as a matched edge. And when the geometrical shape data fall within the threshold value but do not match, the edge is defined as a similar edge. Also, when the geometrical shape data exceed the threshold value, an edge is not generated between the target nodes. At this time, for each node, only an edge that is connected to a corresponding node and that can be maintained at minimum cost is retained, and the other edges are deleted. It should be noted that, when multiple nodes are correlated by an edge as nodes that are similar to a predetermined node, the node for which it is determined that the geometrical shape data are the most similar, i.e., have the most similar shape, is defined as the node having the minimum cost, and the edge that connects this node to the predetermined node is defined as the edge having the minimum cost.

The node list for which the corresponding edges are generated is then evaluated, and unnecessary nodes are deleted (step 1103). First, the nodes at the ends of corresponding edges that are ascertained to be matched are deleted from the node list. This is because, since the sub-bounding tress wherein these nodes are used as parent nodes are completely matched, no further comparison is necessary.

Following this, nodes whose bounding boxes are significantly greater than those of the nodes that were added to the node list at the same time are deleted from the node list. When the node has a bounding box that is significantly greater than the others, it means that the pertinent node is the parent of each node added to the node list at the same time, and that a corresponding edge can be generated for all the nodes that were added to the node list at the same time. In this case, since a difference can be detected only by comparing the child nodes, the nodes having significantly larger bounding boxes need not be compared.

For an edge that is determined to be similar, a check is performed to determine whether both nodes at the ends of the edge have child nodes (step 1104). When there are child nodes, program control returns to step 1101, and the bounding tree is traversed at the level of the child nodes and the nodes are added to the node list. The process for generating a corresponding edge (step 1102) and the process for deleting unnecessary nodes (step 1103) are repeated.

When all the nodes have been traversed (Yes at step 1104), the two node lists include only those nodes that are located at the ends of corresponding edges that are determined to be similar and that do not have child nodes at the lower level, and a node that is not connected by a corresponding edge. These nodes constitute the differences between the two solid/surface models that are to be compared. Thus, node lists A and B are output as the difference lists (step 1105).

The difference list generation processing performed by the difference list generator 40 will now be described using a specific example.

Figure 12:
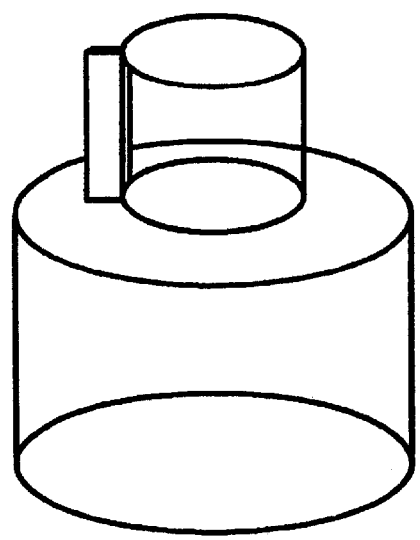
FIG. 12 is a diagram showing a surface model according to the second embodiment that is compared with the surface model in FIG. 3.

FIG. 12 is a diagram showing a surface model to be compared with the surface model in FIG. 3. Hereinafter, the surface model in FIG. 3 is called model A, and the surface model in FIG. 12 is called model B. As is shown in FIG. 12, model B is so shaped that a groove is formed in the side face of the small hole in model A.

Figure 13:
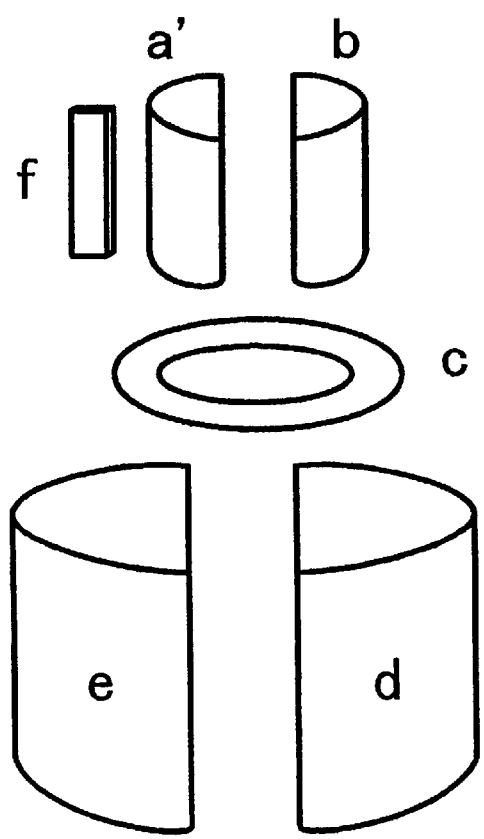
FIG. 13 is a diagram showing patches that constitute the surface model in FIG. 12.

FIG. 13 is a diagram showing patches constituting model B in FIG. 12. Compared with the patches for model A in FIG. 4, a patch f that corresponds to a groove is additionally provided. Since a patch a' is connected to the patch f, the patch a' is not the same as the patch a, but is similar thereto. Four patches b to e in model B are the same as those in model A.

Figure 14:
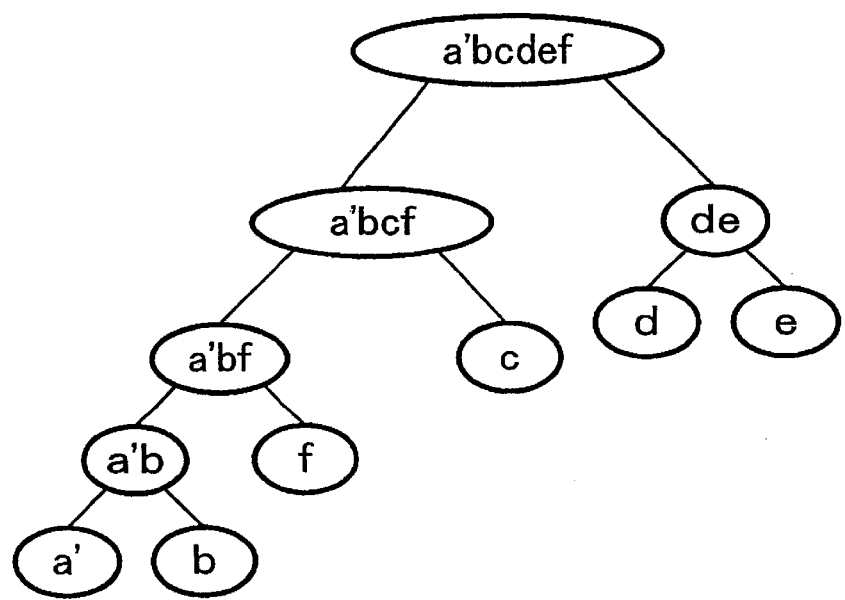
FIG. 14 is a diagram showing the bounding tree of the surface model in FIG. 12.

FIG. 14 is a diagram showing a bounding tree for the model B that is generated by the bounding tree node generator 10, the neighbor graph generator 20 and the bounding tree generator 30. The difference list generator 40 receives the bounding tree for model A in FIG. 9 and the bounding tree for model B in FIG. 14, and generates the difference list. This processing will now be described while referring to node lists in FIGS. 15 to 20.

Figure 15:
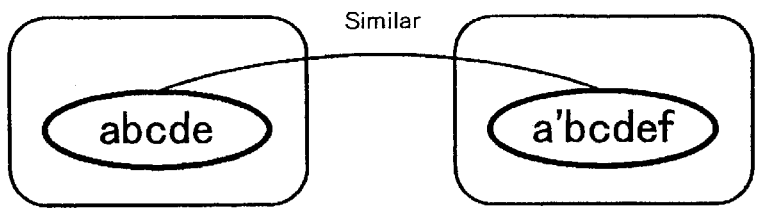
FIG. 15 is a diagram showing the process for preparing node lists used to detect a difference, and the state wherein the nodes at the first level of the bounding trees in FIGS. 9 and 14 are extracted to the lists.
Figure 16:
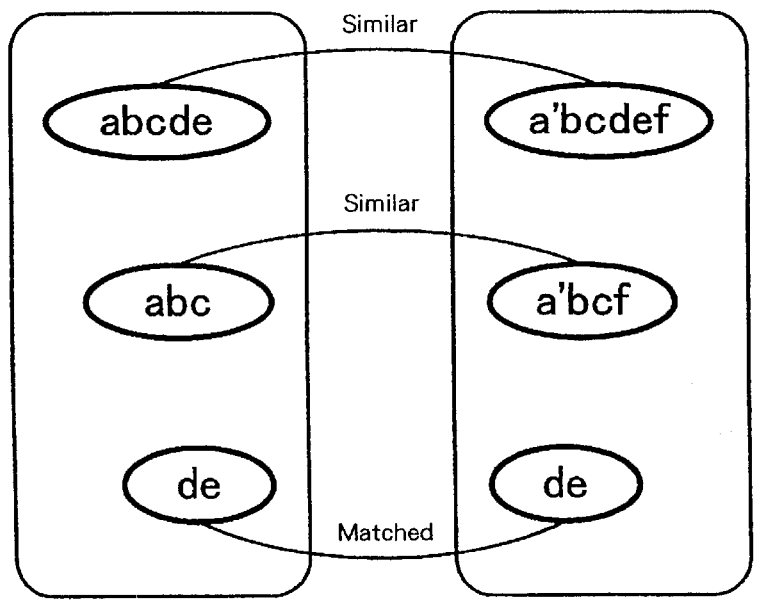
FIG. 16 is a diagram showing the process for the preparation of node lists used to detect a difference, and the state wherein the nodes at the second level of the bounding trees in FIGS. 9 and 14 are extracted and added to the lists.

As is shown in FIG. 15, first, the difference list generator 40 enters, in the node lists, a node {abcde} and a node {a'bcde}, which are parent nodes obtained by the first traverse (step 1101). The difference list generator 40 generates an edge (step 1102), and evaluates it (step 103). Since patches b, c, d and e that belong to the two nodes are matched, the nodes are determined to be similar. Therefore, the nodes at the second level in the bounding trees of model A and model B are entered in the node lists (steps 1104 and 1101). In this example, as is shown in FIG. 16, nodes {abc} and {de} are entered in node list A, and nodes {a'bcf} and {de} are entered in node list B.

Then, corresponding edges are generated (step 1102) and evaluated (step 1103). In this case, of the nodes that are added to the lists, node {abc} and node {a'bcf} are determined to be similar because the patches b and c are matched, and it is determined that the node {de} and the other node {de} match. Therefore, since the nodes {abcde} and {a'bcde} are significantly larger than the added nodes, they are deleted from the lists. Since it is determined that the node {de} is matched, it is also deleted from the lists.

Figure 17:
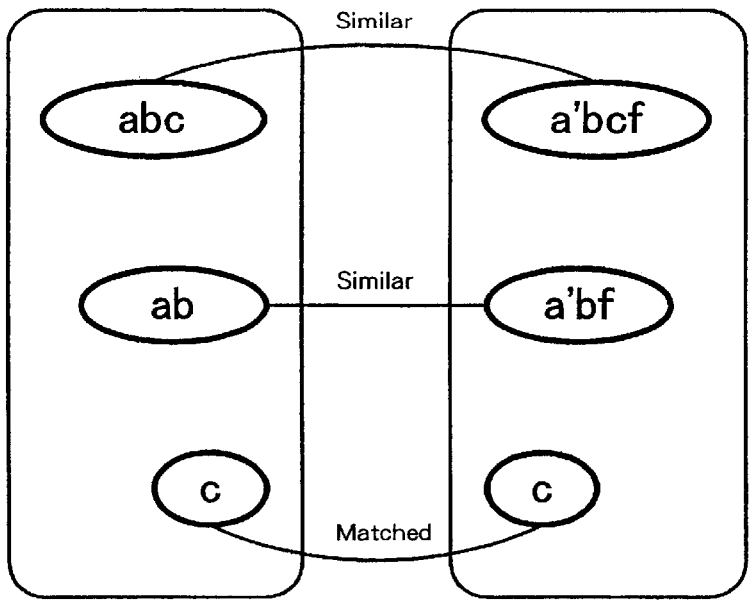
FIG. 17 is a diagram showing the process for preparing node lists used to detect a difference, and the state wherein the nodes at the third level of the bounding trees in FIGS. 9 and 14 are extracted and added to the lists.

Further, since it is determined that the nodes {abc} and {a'bcf} are similar, the nodes at a lower level are added to the lists (step 1104 and 1101). In this case, as is shown in FIG. 17, the nodes {ab} and c are added to the list for model A, and the nodes {a'bf} and c are added to the list for model B.

Figure 18:
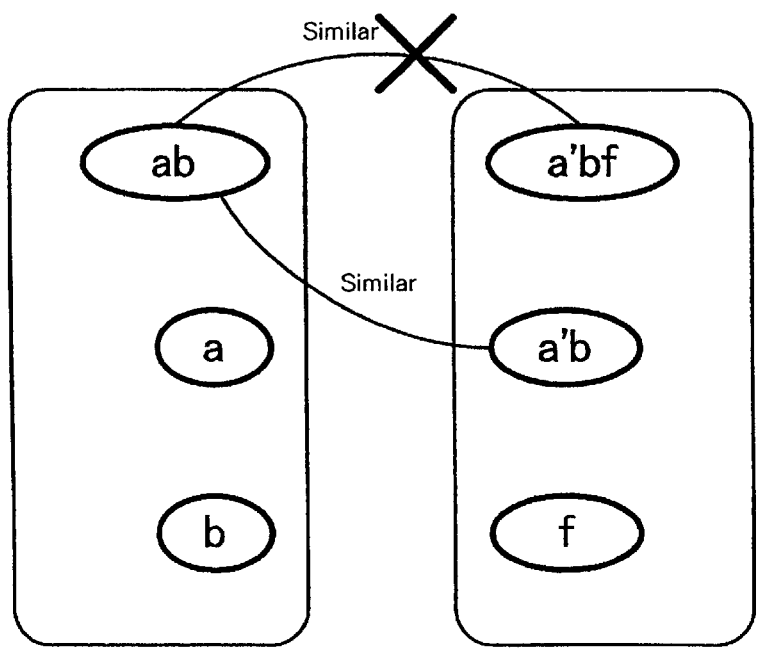
FIG. 18 is a diagram showing the process for preparing node lists used to detect a difference, and the state wherein the nodes at the fourth level of the bounding trees in FIGS. 9 and 14 are extracted and added to the lists.

Next, corresponding edges are generated (step 1102) and evaluated (step 1103). Among the nodes added to the lists, the node {ab} and the node {a'bf} are determined to be similar because the patch b is matched, and the node c is evaluated to be matched. Therefore, since the nodes {abc} and {a'bcf} are significantly larger than the added nodes, these nodes are deleted from the node lists. Since the node c is determined to be matched, it is also deleted from the node lists. Since the nodes {ab} and {a'bf} are determined to be similar, the nodes at a lower level are added to the lists (steps 1104 and 1101). In this case, as is shown in FIG. 18, the nodes a and b are added to node list A, and the nodes {a'b} and f are added to node list B.

Figure 19:
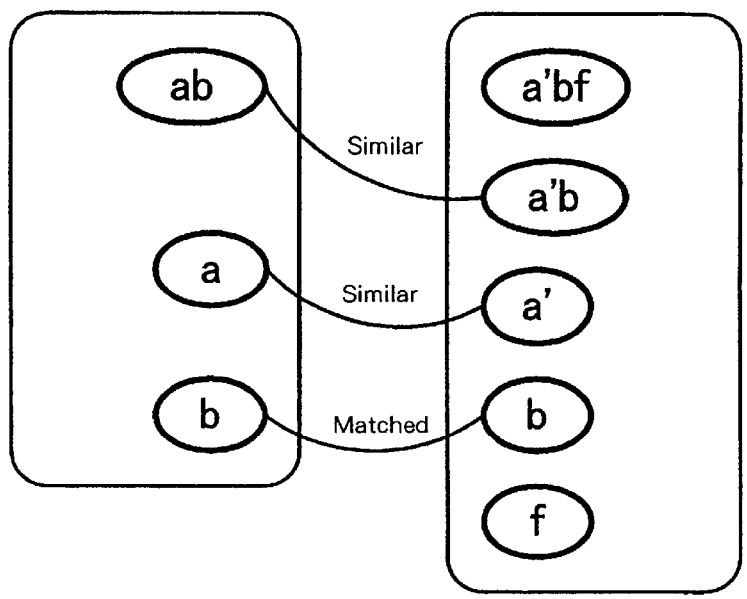
FIG. 19 is a diagram showing the process for preparing node lists used to detect a difference, and the state wherein the nodes at the fifth level of the bounding trees in FIGS. 9 and 14 are extracted and added to the lists.

Then, corresponding edges are generated (step 1102), and evaluated (step 1103). The node {ab} in node list A and the node {a'b} in node list B are determined to be similar because the patch b is matched. Since the node {ab} and the node {a'bf} have been determined to be similar and are connected by an edge, the edge creating to the node {a'bf} is compared with the edge creating to the node {a'b}. As a result, the edge creating to the node {a'b}, which has a small cost, is retained, while the edge creating to the node {a'bf} is deleted. Following this, since the remaining edge connecting the node {ab} and the node {a'b} is determined to be similar, the nodes at a lower level are added to the node lists (steps 1104 and 1101). It should be noted that since the nodes a and b, which are child nodes of the node {ab}, have already been added to the lists, only nodes a' and b are added to node list B, as is shown in FIG. 19.

Figure 20:
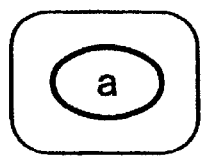
FIG. 20 is a diagram showing difference lists obtained from the bounding trees in FIGS. 9 and 14 in accordance with the second embodiment.
Figure 20:
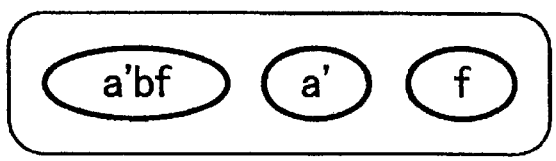

Sequentially, thereafter, corresponding edges are generated (step 1102) and evaluated (step 1103). The node a in node list A and the node a' in node list B are determined to be similar, and the node b in node list A and the node b in node list B are determined to be matched. Since the nodes {ab} and {a'b} are significantly larger than the added nodes, they are deleted from the node lists. And since the node b is determined to be matched, it is also deleted from the lists. While when the node a and node a' are determined to be similar, the traversing of the bounding tree is terminated because there are no more nodes at a lower level. At this time, as is shown in FIG. 20, the node a remains in node list A, and the nodes {a'bf}, a' and f are maintained in node list B. These node lists, A and B, are output as difference lists.

As is described above, in the solid/surface model difference detection system according to this embodiment, the bounding tree generator 10, the neighbor graph generator 20 and the bounding tree generator 30 analyze, for each patch, the shapes of target solid/surface models, and compare them by using hierarchical bounding trees prepared in accordance with a specific rule. Further, in the bounding trees, nodes hold geometrical information concerning the type of shape, such as a hole or a groove, and the size of a specific shape. The topological information indicating the number of specific shapes and their positions are reflected in the number and the positions occupied by nodes. Therefore, when the bounding trees are compared with each other, even a minor change that is very difficult to identify merely by examining a solid/surface model depicted on a display device can be easily detected.

Therefore, when solid/surface models for the same product that are managed in multiple databases are compared with each other in accordance with the system of this embodiment, and when a difference is detected, one solid/surface model can be updated, and the translation, the scaling, the addition or the deletion of the components can be identified. Thus, the other solid/surface models can also be immediately updated.

Further, since the geometrical information and the topological information for the difference between the two solid/surface models are included in the difference lists produced by the comparison of the bounding trees, it is possible to identify the contents of the geometrical and topological changes effected for the solid/surface model that has been updated. Therefore, based on the geometrical information and the topological information that are reflected in the difference lists, a non-updated solid/surface model can be automatically updated.

The solid/surface model difference detection system of this embodiment detects a difference in multiple solid/surface models by using the geometrical information for a solid/surface model that is prepared by a machine CAD system.

Further, since the topological information for the model can be obtained during the generation of a bounding tree, the topological information can be applied for a set of patches for a solid/surface model that does not include its topological information. The IGES that is compatible (available for output) with many machine CAD systems is employed as a data format that does not have the topological information for patches. Therefore, for general purposes, the technique of this embodiment for detecting differences between solid/surface models is especially appropriate.

In the above embodiment, for generating a bounding tree from a solid/surface model, the solid/surface model difference detection system comprises the bounding tree node generator 10, the neighbor graph generator 20 and the bounding tree generator 30; however, this system can be so designed that bounding trees for multiple solid/surface models are stored in a database, and, as needed, can be read out and used for comparisons.

Third Embodiment

Figure 21:
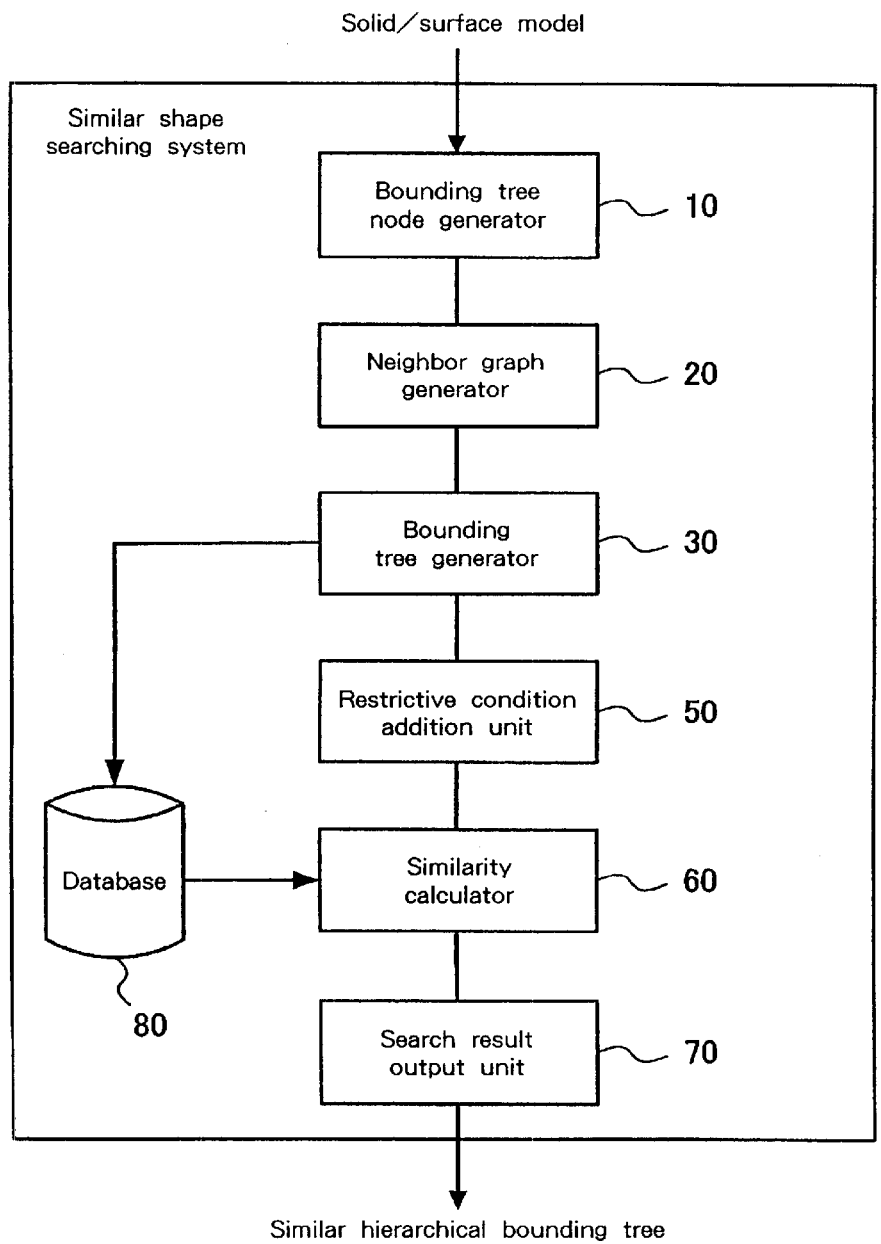
FIG. 21 is a diagram for explaining the general configuration of a similar shape search system according to a third embodiment of the present invention.

FIG. 21 is a diagram for explaining the general configuration of a similar shape search system according to a third embodiment of the present invention.

In FIG. 21, a bounding tree node generator 10, a neighbor graph generator 20 and a bounding tree generator 30 are the same as those used for the shape analysis system according to the first embodiment in FIG. 1. A restrictive condition addition unit 50 defines a restrictive condition for searching for a solid/surface model that is similar to a predetermined solid/surface model. A similarity calculator 60 calculates the similarity (the similarity) existing between a solid/surface model that satisfies the restrictive condition defined by the restrictive condition addition unit 50 and a solid/surface model that serves as a search reference (reference model). A search result output unit 70 outputs a solid/surface model that, through calculation, is found to be as similar to the reference model. A database 80 is used to store solid/surface models, and the solid/surface model that is similar to the reference model is obtained from the solid/surface models stored in the database 80.

Since the bounding tree generation process performed by the bounding tree node generator 10, the neighbor graph generator 20 and the bounding tree generator 30 is the same as that performed by the corresponding units in the shape analysis system according to the first embodiment, no further explanation for this function will be given.

The similar shape search system of the third embodiment is designed to search for a solid/surface model having a desired shape among the models stored in the database 80. Therefore, the search reference need not always be a solid/surface model for a conventional product. In other words, a user may newly create a reference model having a desired shape. Further, the user may combine simple $3d$-shapes corresponding to bounding boxes to create a graph corresponding to a neighbor graph that represents the structure of a desired reference model, and may employ the bounding tree generator 30 to generate a bounding tree from the graph.

The restrictive condition addition unit 50 defines a geometrical restrictive condition and a topological restrictive condition (hereinafter collectively referred to simply as a restrictive condition) for performing a search for a desired solid/surface model in the database 80 in accordance with an instruction entered by a user. The defined restrictive condition is added to the bounding tree of a reference model that is generated by the bounding tree node generator 10, the neighbor graph generator 20 and the bounding tree generator 30, and the resultant bounding tree is used as a search key. When, depending on a search purpose, no restrictive condition is particularly required, the bounding tree of a reference model to which a restrictive condition has not been added is employed as a search key.

There are two types of restrictive conditions that function in accordance with the portions of a bounding tree to which they are added: (1) a restrictive condition for a single node, and (2) a restrictive condition for a relationship consisting of two nodes.

The restrictive condition for a single node is provided as attribute information for a pertinent node. As a restrictive condition the size of a bounding box (the volume, the lengths of the sides and the aspect ratio of the sides) can be designated, the size of a bounding box can be ignored, or an object type (a hole, etc.) represented by the node can be designated.

The restrictive condition for the relationship of two nodes is added as a restrictive edge to a bounding tree. As the restrictive condition, the distance between two bounding boxes can be designated, or can be ignored.

The similarity calculator 60 compares the search key, which is obtained by adding, as needed, a restrictive condition to the bounding tree of the reference model, with the bounding tree of a solid/surface model stored in the database 80, and calculates the similarity of a match being obtained. The bounding tree of the solid/surface model stored in the database 80 is generated by the bounding tree node generator 10, the neighbor graph generator 20 and the bounding tree generator 30.

When a priority level is given for a restrictive condition that is added by the restrictive condition addition unit 50, the priority level is for the topological information and the geometrical information that the similarity calculator 60 should take into account for the calculation of the similarity.

In this embodiment, two comparison methods are employed by the similarity calculator 60: an overall match, for calculating the similarity that the shapes of two models will correspond; and a partial match, for determining whether a predetermined condition has been established. That is, for an overall match, a solid/surface model having a shape similar to the reference model that is used as a search key is detected in the database 80. And for a partial match, a solid/surface model that matches a restrictive condition defined by the restrictive condition addition unit 50 is detected in the database 80. Specifically, a solid/surface model that has a topological characteristic, such as the presence of two holes, or a geometrical characteristic such as the diameter of a hole or the distance between two holes.

The operation of the similarity calculator 60 for an overall match will now be described.

The similarity calculator 60 prepares node lists for bounding trees, generates similarity edges between nodes that establish a predetermined similarity condition, and search for a best match to calculate the similarity.

Figure 22:
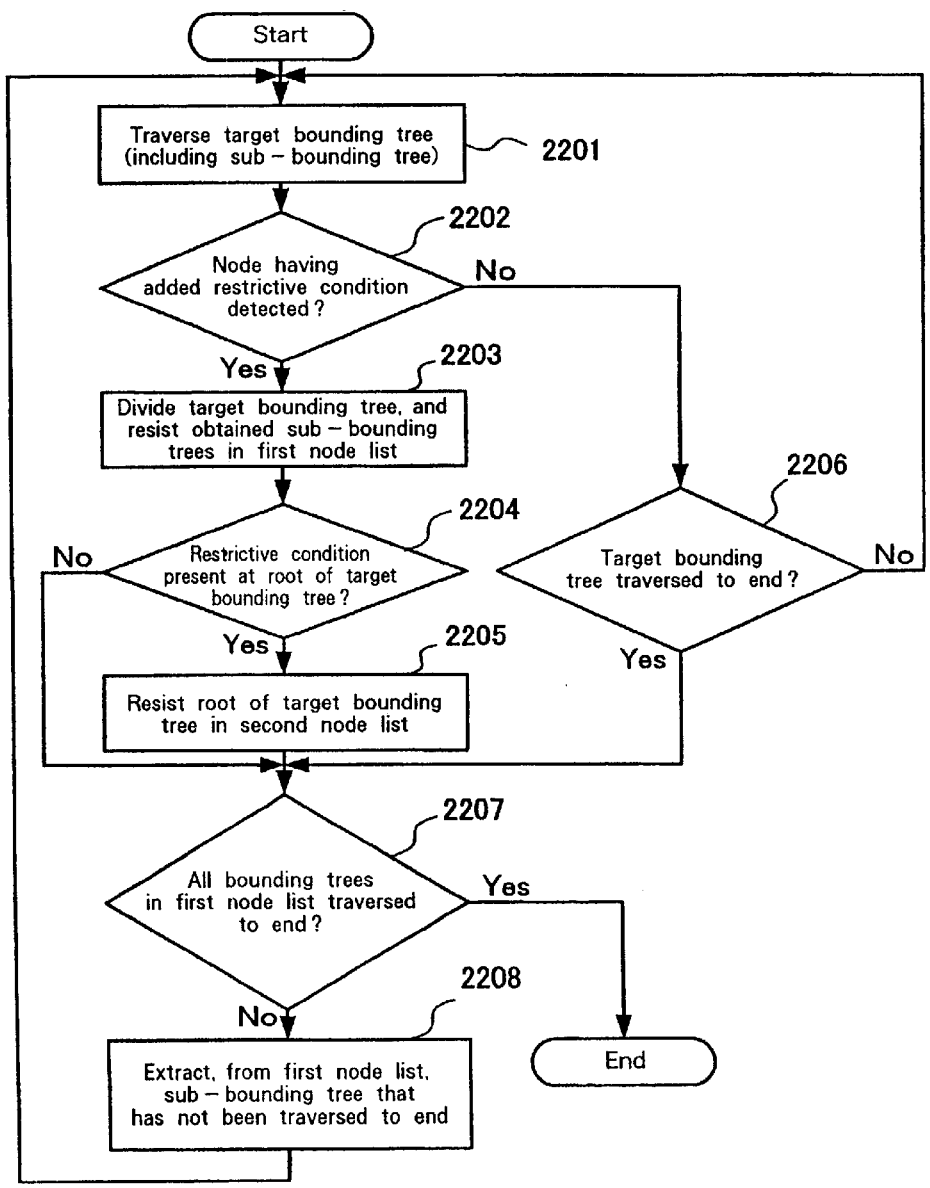
FIG. 22 is a flowchart for explaining the processing performed by a similarity calculator to prepare node lists in accordance with the third embodiment.

FIG. 22 is a flowchart for explaining the node list preparation processing performed by the similarity calculator 60. When a restrictive condition is not added to a bounding tree for which a node list is to be generated, the node list is prepared wherein child nodes for the root of the bounding tree are registered. When a restrictive condition is added to the bounding tree, the processing in FIG. 22 is recurrently performed to divide the bounding tree, and a node list is generated. Each step of this processing will now be described.

In FIG. 22, the similarity calculator 60 traverses a bounding tree or a sub-bounding tree in the Breadth First search manner (step 2201). When a node to which a restrictive condition is added is detected, the traversing is halted, the target bounding tree or sub-bounding tree is divided, and the obtained sub-bounding trees are registered in the first node list (steps 2202 and 2203). During this process, the target bounding tree or sub-bounding tree is divided into a sub-bounding tree that employs, as a root, the detected node to which the restrictive condition is added, and a set of other sub-bounding trees.

Then, a check is performed to determine whether a restrictive condition has been added to the root of the bounding tree or the sub-bounding tree obtained at step 2203. If a restrictive condition is found at the root of the bounding tree or the sub-bounding tree, the root of the bounding tree or the sub-bounding tree are registered in the second node list (steps 2204 and 2205).

The above process is recurrently performed for all the sub-bounding trees registered in the first node list (steps 2207 and 2208). When the end of the target bounding tree or sub-bounding tree is reached without detecting the restrictive condition at step 2202 (step 2206), a check is performed to determine whether a sub-bounding tree that has not yet been traversed is present in the first node list. If there is an unprocessed sub-bounding tree, the above processing is recurrently repeated for this tree. The process is repeated until all of the bounding tree is traversed to its end (steps 2207 and 2208).

At step 2202, when the traversing of the bounding tree or the sub-bounding tree is completed while the node to which the restrictive condition has been added is not detected, the pertinent bounding tree or sub-bounding tree is registered in the first node list (step 2206). Therefore, if a node to which the restrictive condition has been added is not present in a bounding tree, the bounding tree must be registered unchanged in the first node list. And when a node to which the restrictive condition has been added is present and when the bounding tree is divided at step 2203, sub-bounding trees to which the node with the restrictive condition has been added are not included as a child node are registered in the first node list. And the root of the bounding tree or the sub-bounding tree to which the restrictive condition has been added and that has been divided is registered in the second node list.

The node list generation processing performed by the similarity calculator 60 will now be described using a specific example.

Figure 23:
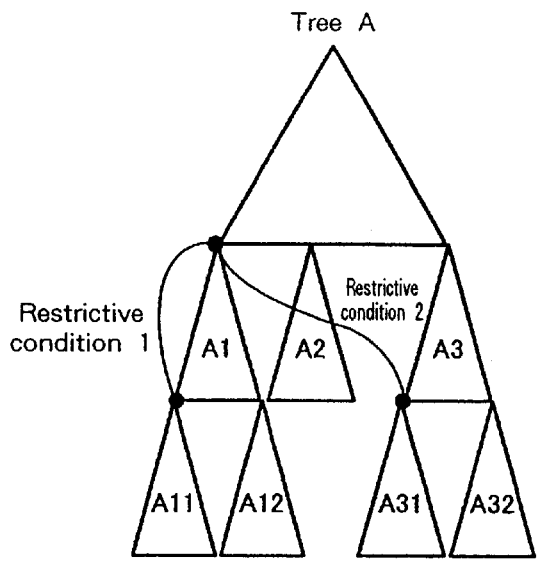
FIG. 23 is a diagram showing the structure of a bounding tree A for which a node list is to be prepared in accordance with the third embodiment.

FIGS. 23 to 26 are diagrams showing the processing for generating a node list for a bounding tree A. In FIG. 23, the bounding tree A that is to be processed includes sub-bounding trees A1 to A3, the sub-bounding tree A1 includes sub-bounding trees A11 and A12, and the sub-bounding tree A3 includes sub-bounding trees A31 and A32. The sub-bounding trees A1 to A3, A11, a12, A31 and A32 are generated when the bounding tree or the sub-bounding trees are divided during the preparation of the node list that will be described later, and are registered in the first and the second node lists. A restrictive condition 1 is added between the sub-bounding trees A1 and A11, and a restrictive condition 2 is added between the sub-bounding trees A1 and A31.

Figure 24:
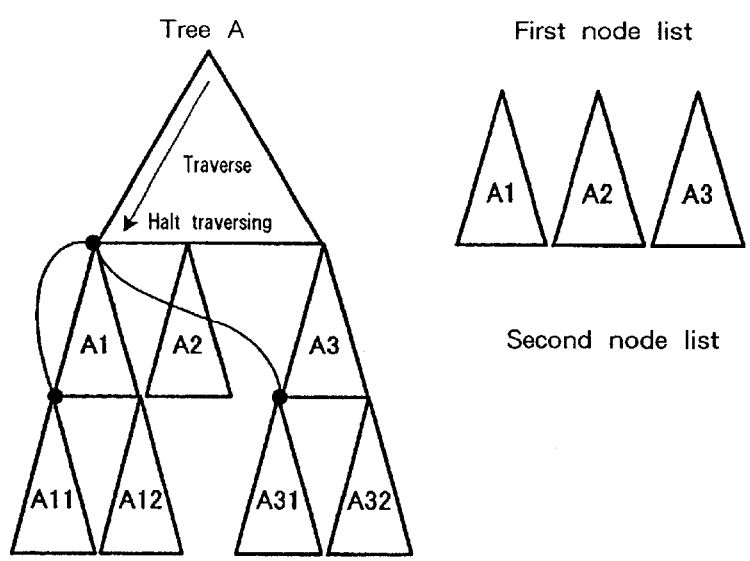
FIG. 24 is a diagram showing the state wherein the sub-bounding tree at the first level of the bounding tree in FIG. 23 is extracted and added to the node list.

First, the bounding tree A is recurrently traversed until the restrictive condition is found (steps 2201 to 2206). Since a node to which the restrictive condition has been added is found in the sub-bounding tree A1, the bounding tree A is divided into the sub-bounding tree A1 and the sub-bounding trees A2 and A3, which constitute a portion other than the bounding tree A1, and the bounding trees A1 to A3 are registered in the first node list (steps 2202 and 2203). This state is shown in FIG. 24. At this time, since the sub-bounding trees A1, A2 and A3 in the first node list have not yet been fully traversed, scanning is performed recurrently beginning with the sub-bounding tree A1 (steps 2207 and 2208).

When the sub-bounding tree A1 is traversed (steps 2201 to 2206), the restrictive condition 1 is detected at the sub-bounding tree A11. Thus, the sub-bounding tree A1 is divided into the sub-bounding trees A11 and A12, which are registered in the first node list (steps 2202 and 2203).

Figure 25:
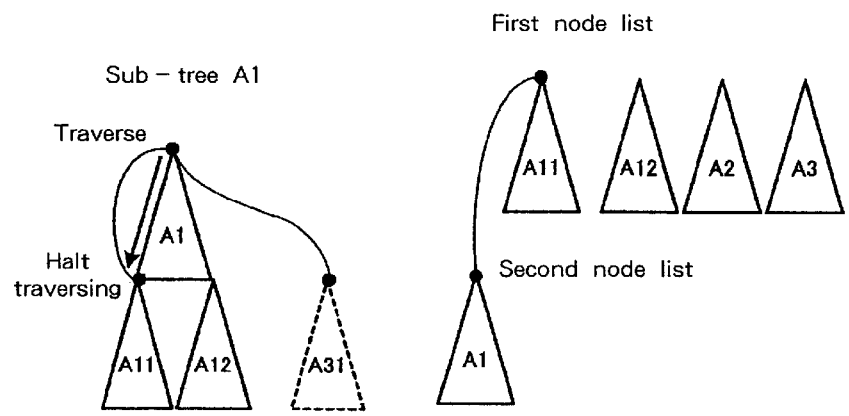
FIG. 25 is a diagram showing the state wherein a sub-bounding tree A1 in FIG. 24 is divided.

Since the restrictive condition 1 has been added to the sub-bounding tree A1, tree A1 is registered in the second node list (steps 2204 and 2205). This state is shown in FIG. 25.

Since the restrictive condition is not detected by traversing to the end the sub-bounding trees A11 and A12, the traversing for these portions is thereafter terminated (step 2206).

The sub-bounding tree A2 is traversed to the end in the same manner, and since the restrictive condition is not thereby detected, the traversing is terminated (step 2206).

The sub-bounding tree A3 is then traversed (steps 2207, 2208 and 2201), and the restrictive condition 2 is detected in the sub-bounding tree A31. Thereafter, the sub-bounding tree A3 is divided into the sub-bounding tree A31 and the sub-bounding tree A32, which are registered in the first node list (step 2202 and 2203). Since there is no restrictive condition in the sub-bounding tree A3, this tree is not registered in the second node list. This state is shown in FIG. 26.

Figure 26:
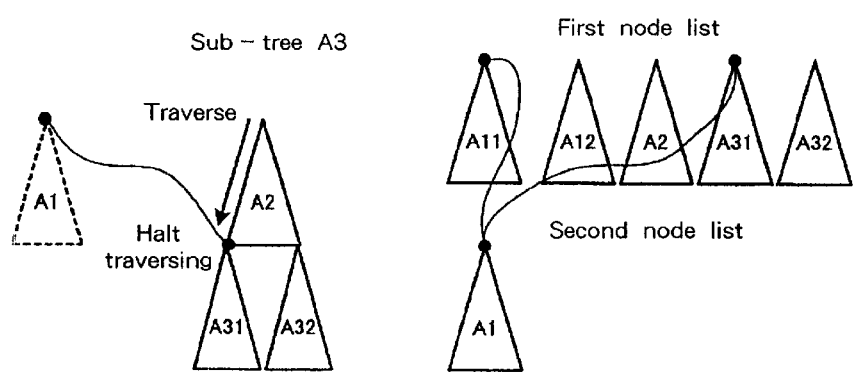
FIG. 26 is a diagram showing the state wherein a sub-bounding tree A3 in FIG. 24 is divided.

Since the restrictive condition is not detected by traversing to the end the sub-bounding trees A31 and A32, the first and the second node lists in FIG. 26 are finally obtained. As is apparent from the above processing, the nodes in these node lists are the bounding tree or the sub-bounding trees themselves, and differ from the nodes that constitute the bounding tree itself.

The similarity calculator 60 sequentially reads the sub-bounding tree from the database 80, and examines the sub-bounding tree to determine the similarity that exists between it and the reference model. In the following explanation, the bounding tree for the reference model is defined as an object A, and the bounding tree read from the database 80 is defined as an object B. It is assumed that the object A is the same as the bounding tree A that is divided in the processing shown in FIGS. 23 to 26.

First, the object B is traversed in the Breadth First search manner, and is compared with sub-bounding trees on the first and the second node lists. A bounding tree that has a geometrical shape that is similar to the sub-bounding tree on the first node list is registered in the third node list. Whether or not the sub-bounding tree on the first node list is similar in its geometrical shape to the sub-bounding tree of the object B is determined by comparing the similarity that are obtained by using the numerical geometrical information value of the bounding tree. Various conventional methods for determining the similarity of the bounding tree can be employed. Multiple proposed bounding trees that have a similarity equal to or smaller than a predetermined threshold value, or a bounding tree that has merely a minimum similarity may be registered in the third node list.

Similarly, a sub-bounding tree that is similar to the sub-bounding tree in the second node list, in accordance with the parameter to which the restrictive condition is added, is entered in the fourth node list. When the bounding tree is similar in accordance with the parameter to which the restrictive condition has been added, it means that the bounding tree is very likely the result of a comparison performed under only a restrictive condition, such as the size of the bounding box, the object type or the distance between two bounding boxes. As well as for the third node list, multiple proposed bounding trees that have a similarity equal to or smaller than a predetermined threshold value, or a bounding tree that has only the minimum similarity may be registered in the fourth node list.

Figure 27:
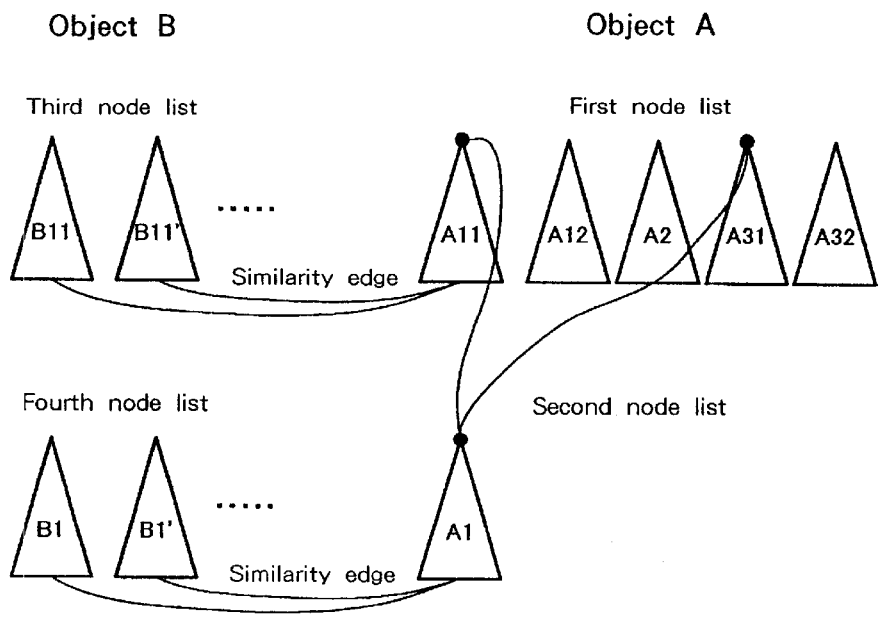
FIG. 27 is a diagram showing the state wherein similarity edges are created between the node lists for multiple objects in accordance with the third embodiment.

Among the nodes registered in the third and fourth node lists and the nodes registered in the first and the second node lists, the nodes that are similar to each other are connected by similarity edges, as shown in FIG. 27. For an overall match, the similarity edges are created for all the sub-bounding trees of the object A, which is the bounding tree of the reference model.

The similarity calculator 60 compares the node lists between which the similarity edges are created, and obtains the best match. For this, a well known algorithm that is used to obtain the best match available, by using two graphs that include several nodes and show their relationships, is a backtrack search method or a compound graph method.

The back track search method is a method that provides for the round robin comparison of nodes in the two graphs. When predetermined nodes are correlated, the next probable correlation is selected in accordance with the relationships among the nodes, so that the selection of node correlation is written as a tree, and a branch having a low similarity is removed. Thus, the processing speed can be increased.

The compound graph method is a method for detecting an extremely large creek in the compound graph. When there are two sets, $V_1$ and $V_2$, of elements, properties $P_1$ and $P_2$ and binary relations $R_1$ and $R_2$ are defined for the elements, and this method is generally employed to compare the two sets in the graph. First, when a pair of nodes that have similar properties are extracted from the sets $V_1$ and $V_2$, and are defined as nodes for the compound graph. A set of node pairs that is established at the same time is called a creek. Then, when the elements having the binary relations $R_1$ and $R_2$ are established, the nodes in the compound graph are connected by an edge. According to the obtained relations $(V_1, P_1, R_1)$ and $(V_2, P_2, R_2)$, a set (an extremely large creek) of nodes in the compound graph is defined as the best match.

In this embodiment, the processing using the compound graph method will now be described.

Figure 28:
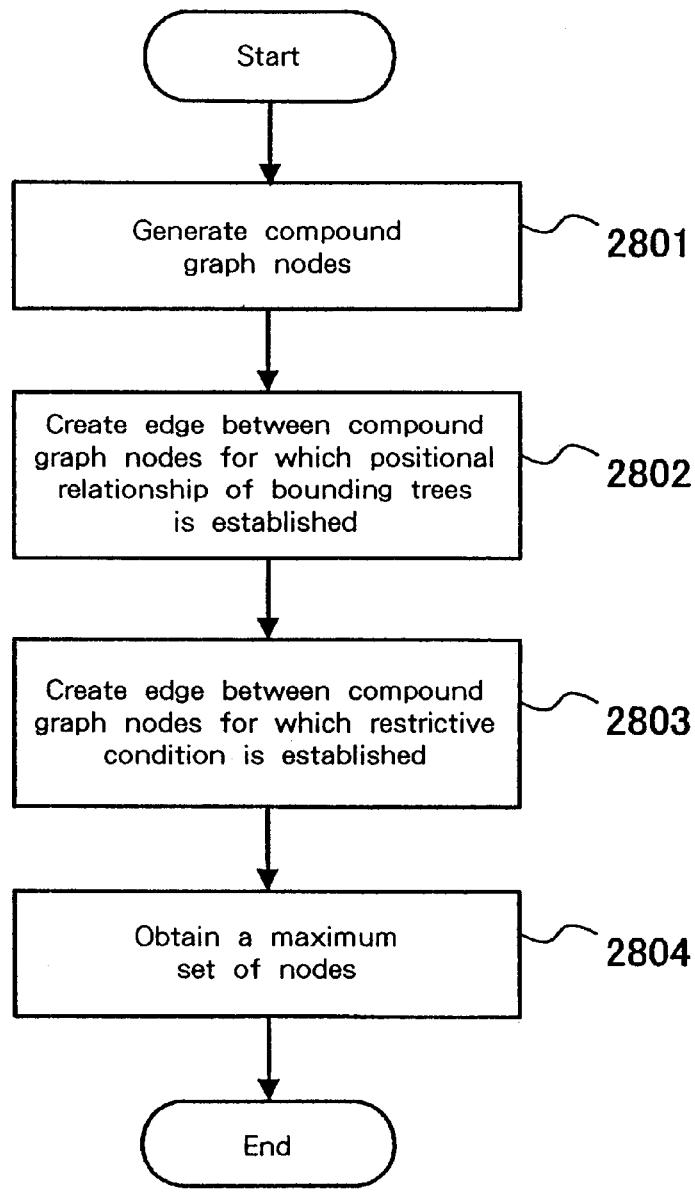
FIG. 28 is a flowchart for explaining the best match search processing performed by the similarity calculator in accordance with the third embodiment.
Figure 29:
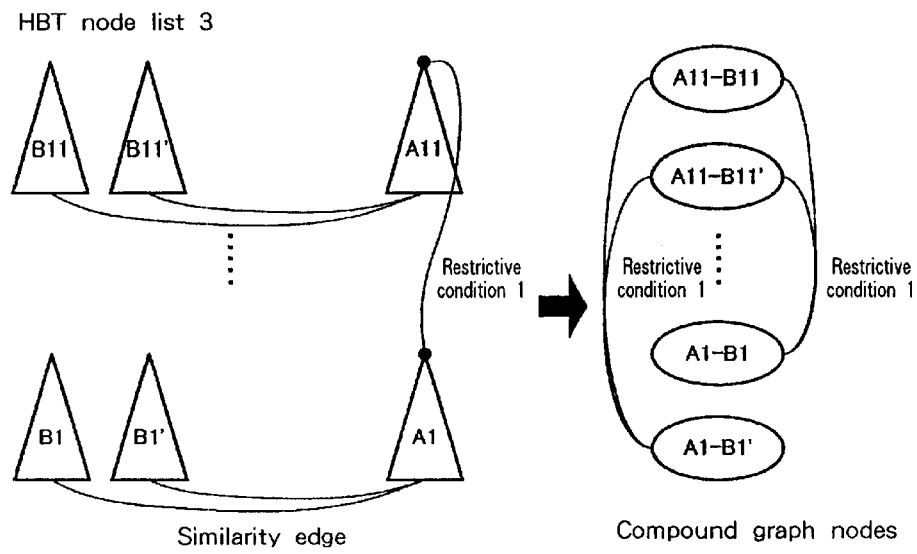
FIG. 29 is a diagram showing the state wherein compound graph nodes are generated using node lists that are connected by similarity edges in accordance with the third embodiment.
Figure 30:
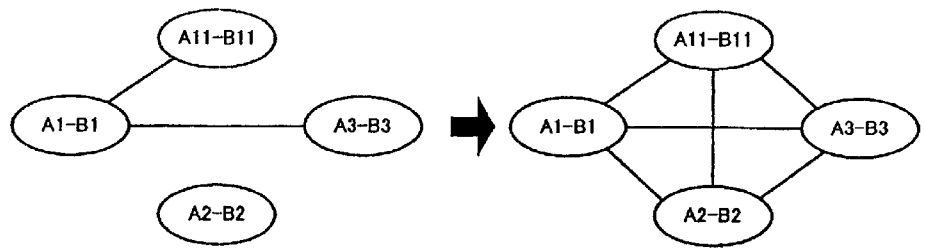
FIG. 30 is a diagram showing the state wherein a compound graph is generated in accordance with the third embodiment.
Figure 31:
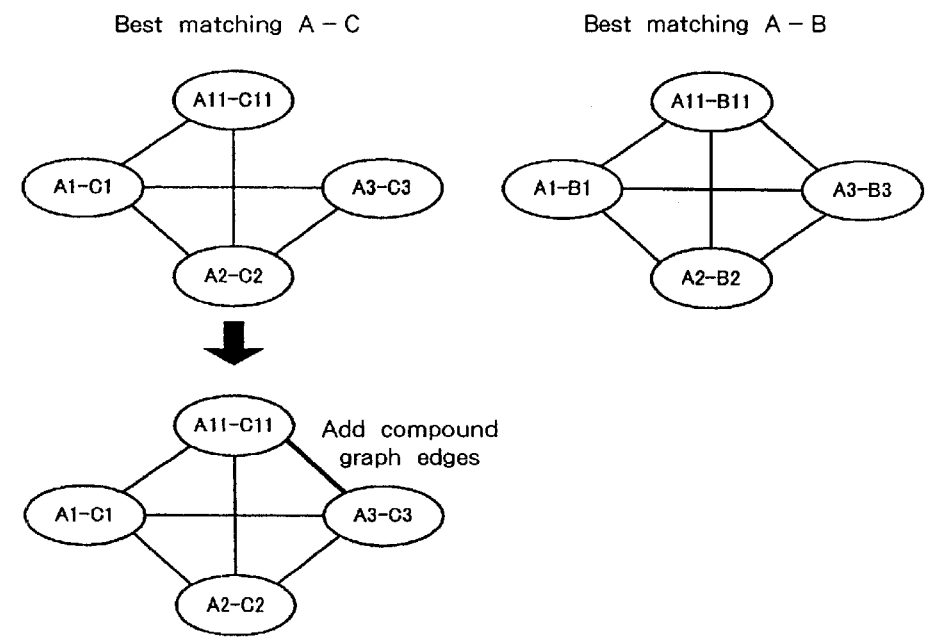
FIG. 31 is a diagram for explaining the processing performed in accordance with the third embodiment for calculating the similarity of bounding trees.

FIG. 28 is a flowchart for explaining the best matching search process that can be performed by the similarity calculator 60. And FIGS. 29 to 31 are diagrams showing the processing for generating a compound graph using node lists wherein similarity edges are created, and for calculating the similarity.

In FIG. 28, first, the nodes of a compound graph that consists of sub-bounding trees belonging to the object A and the sub-bounding trees belonging to the object B are generated for the respective similarity edges (step 2801). Specifically, as shown in FIG. 29, the nodes for the compound graph are generated from pairs of sub-bounding trees in the objects A and B wherein similarity edges are created. At this time, since the restrictive condition 1 is set between the sub-trees A11 and A1, the restrictive condition 1 is inherited by all the nodes in the compound graph, including the sub-bounding trees A11 and A1.

Following this, for the pairs of compound graph nodes that are generated, a check is performed to determine whether both a positional relationship for the sub-bounding trees of the object A that constitute the compound graph nodes, and a positional relationship for the sub-bounding trees of the object B have been established. And edges are created between the compound graph nodes, the positional relationship of which is established (step 2802). For example, for the compound graph nodes A1–B1 and A3–B3, we will discuss the positional relationship between the sub-bounding trees A1 and A3 of the object A, and the positional relationship between the sub-bounding trees B1 and B3 of the object B. First, the numerical value of the portion of the object A that corresponds to the sub-bounding trees A1 and A3 is compared with the numerical value of the portion of the object B that corresponds to the sub-bounding trees B1 and B3. When the difference between them is equal to or smaller than a threshold value, the positional relationship between the two portions is established, and the nodes A1–B1 and the nodes A3–B3 are connected by the compound graph edge.

When the restrictive condition is added to the nodes in the compound graph, a check is performed to determine whether the restrictive condition has been established between the compound graph nodes, and an edge is created between the nodes for which the restrictive condition has been established (step 2803). For example, for compound graph nodes A11–B11 and nodes A1–B1, to which the restrictive condition has been added, when the restrictive condition 1 between the sub-bounding trees A11 and A1 is satisfied by the sub-bounding trees B11 and B1, a value of 0 is set. If the restrictive condition is not satisfied, the value is changed in accordance with the distance between the restrictive condition 1 and the positional relationship of the sub-bounding trees B11 and B1. When the obtained value is equal to or smaller than the threshold value, it is assumed that the restrictive condition has been established, and that the nodes A11–B11 and the nodes A1–B1 are connected by the compound graph edge. Similarly, the same process is performed to examine the other pairs of compound graph nodes.

Finally, the maximum set of nodes that are interconnected (can be mutually established) in the compound graph is obtained (step 2804). FIG. 30 is a diagram showing the processing for generating a compound graph. As is shown in FIG. 30, the nodes for which the positional relationship and the restrictive condition are established are connected by the compound graph edges, and the compound graph wherein maximum compound graph nodes are interconnected is defined as the best match (extremely large creak).

The above process for obtaining the best match may be performed for all bounding trees stored in the database 80. Or, the data for the bounding trees in the database 80 may be stored in advance in accordance with the product types, and the best match may be performed as needed only for the bounding trees of a required product.

When the best match with the object A is obtained for a desired bounding tree in the database 80, the similarity calculator 60 calculates the similarity between the object A and each other object. The calculation of the similarity is performed for the object A and for each other object with which it is to be compared.

First, compound graph edges are added to all the best matches that are related to the object A, which is the search key, and for multiple objects that are to be compared, so that all the compound graph node combinations can be connected by the compound graph edges. The sum of the similarity of the sub-bounding tree of each compound graph node and the similarity of the compound graph edge are defined as the similarity for the two bounding trees that are to be compared.

FIG. 31 is a diagram for explaining the process for calculating the similarity for the bounding trees. In FIG. 31, the process is shown after the best match has been obtained for the object A and the objects B and C, which are comparison targets.

In FIG. 31, the best match A–B for the objects A and B, and the best match A–C for the objects A and C are obtained. Since the compound graph edge is present for the best match A–B, the similarity can be calculated without changing the match. However, since there is no compound graph edge present for the best match A–C, a missing compound graph edge is added to calculate the similarity.

The above described method (compound graph method) for obtaining a best match is merely an example. Actually, various conventional algorithms can be arbitrarily employed to obtain a best match using two graphs that represent several nodes and their relationships.

The operation performed by the similarity calculator 60 for an overall match has been specifically explained, and the process for a partial match can be performed using the same algorithm as is used for the overall match. The only difference between the overall match and the partial match is that, for a connection between the nodes on the first and the second node lists and the nodes on the third and the fourth node lists, which are similar to each other, the similarity edge is created only between the sub-bounding trees that correspond to the portions to be compared. Therefore, the operation of the similarity calculator 60 for partial matching will not be explained.

When the similarity calculator 60 obtains the similarity between the bounding tree of the reference model and the bounding tree read from the database 80, based on the similarity, the search result output unit 70 outputs, as the search result, the bounding tree that is read from the database 80. The search result output unit 70 may output only the bounding tree that is the most similar (has the highest similarity) to the reference model, or may output all the bounding trees for which similarity is evidenced within a specific range (wherein the similarity is equal to or greater than a predetermined threshold value).

The search results can be displayed as a correlation between the components and the restrictive condition of the bounding tree of the reference model that constitutes a search key, and the components of the bounding tree that is obtained through the search. Further, for the solid/surface model that corresponds to the bounding tree obtained through the search, a portion different from the reference model can be displayed using different colors. In this case, based on the correlation of the bounding tree obtained through the search, the portion that differs greatly from the reference model and the portion that differs slightly therefrom may be displayed using different colors.

As is described above, in accordance with the similar shape search system according to this embodiment, the bounding tree node generator 10, the neighbor graph generator 20 and the bounding tree generator 30 analyze the shape of a target solid/surface model for each path, and find a shape similar to a search key by using a hierarchical bounding tree that is obtained in accordance with a predetermined rule. Further, to make it possible for the bounding tree to be compared, the node holds geometrical information that represents the shape type, such as a hole or a groove, and the size of a specific shape. Further, the topological information indicating the number of specific shapes and their positions is reflected by the number of nodes and their positions. Therefore, when the bounding tree is employed to find a similar shape, not only a model that has a fully corresponding shape, but also a model whose specific portion is matched or is similar in shape, or a model that satisfies a topological condition, such as the number of holes or protrusions, can be searched for.

As is described above, according to the present invention, electronic shape data for parts are automatically compared in a database, and differences between them can be detected.

As a result, data can be automatically and immediately updated in accordance with any change in design.

Further, through the comparison of electronic shape data for parts, a product that is similar in shape to a product that is required can be automatically detected using design data acquired in the past.

It is noted that although the description of the invention is made for particular arrangements of steps, the intent and concept of the present invention are suitable and applicable to other arrangements. The present invention can be realized in hardware, software, or a combination of hardware and software. It may be implemented as an article of manufacture and/or a computer product.

The present invention can be realized in a centralized fashion in one computer system, or in a distributed fashion where different elements are spread across several interconnected computer systems. Any kind of computer system —or other apparatus adapted for carrying out the methods described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context is meant to include any expression, in any language, code or notation, of a set of instructions intended to cause a system having an information processing capability to perform a particular function either directly or after either or both of the following a) conversion to another language, code or notation; b) reproduction in a different material form.

What is claimed is:

1. A shape analysis system comprising:
    an analysis tree node generator for generating for each patch forming a three-dimensional shape model, a simple 3$d$-shape that encloses said patch, and for generating, for a shape analysis tree, a node that corresponds to said simple 3$d$-shape;
    a neighbor graph generator for generating an edge between said nodes that are generated by said analysis tree node generator and that are geometrically adjacent, so as to produce a neighbor graph; and
    an analysis tree generator for merging based on a condition for first merging nodes wherein the shape of said patch is continuous, nodes in said neighbor graph that are generated by said neighbor graph generator and that are connected by said edge, for generating a new node in correlation with a new simple 3$d$-shape that encloses patches included in said merged nodes, and for generating a shape analysis tree wherein said new node acquired by merging is defined as a parent node and the other nodes, before being merged, are defined as child nodes.

2. The shape analysis system according to claim 1, wherein said analysis tree node generator receives each patch for said three-dimensional shape model, generates, for said patch, a simple 3$d$-shape that encloses the object of said patch, and generates, in correlation with said simple 3$d$-shape, a node that includes information concerning the size of said simple 3$d$-shape and information concerning the continuity of said surfaces of said object that is enclosed in said simple 3$d$-shape.

3. The shape analysis system according to claim 2, wherein, as for said nodes that are connected by said edge in said neighbor graph, which is generated by said neighbor graph generator and which reflects said continuity of said shape of said patch, said analysis tree generator merges said nodes based on information, included in said nodes, that concerns said continuity of said surfaces of said object, and generates a new node as well as a partial shape analysis tree that employs said new node; and wherein, based on information concerning the size of a simple 3$d$-shape that corresponds to said new node and other nodes that have not been merged and based on said information that concerns said continuity of said surfaces of said object, said analysis tree generator merges said new node and the other nodes until all of said nodes in said neighbor graph are merged and form a single simple 3$d$-shape.

4. A shape analysis system for a three-dimensional model comprising:
    a node generator, for generating, for each patch constituting a three-dimensional shape model, a node that, for said path, stores geometrical information concerning said three-dimensional shape model;
    a neighbor graph generator, for employing said node obtained by said analysis tree node generator to generate a neighbor graph in which said geometrically adjacent relationship in said three-dimensional shape model is reflected; and
    an analysis tree generator, for employing said neighbor graph produced by said neighbor graph generator to merge nodes for which corresponding patches are adjacent in said three-dimensional shape model, and for generating a shape analysis tree wherein a new node obtained by merging is defined as a parent node and the other nodes before being merged are defined as child nodes.

5. A difference detection system for a three-dimensional shape model comprising:
    an input unit, for entering tree structures, each of which includes a node that stores geometrical information for each path that constitutes said three-dimensional shape model and in each of which geometrical information for said patch is reflected; and
    a difference detector, for comparing said tree structures to detect differences.

6. The difference detection system for a three-dimensional shape model according to claim 5, wherein said path that constitutes said three-dimensional shape model and is used as data to generate said tree structure, which is used for difference detection, is a patch that corresponds to a data format and that does not include said topological state.

7. The difference detection system for a three-dimensional shape model according to claim 5, wherein said difference detector compares, beginning at said roots, the individual sub-trees of said tree structures of said shape analysis trees that correspond to multiple models in depth order, and determines whether sub-trees of said shape analysis trees, which employ corresponding nodes as roots, match; and wherein only said sub-trees that have not been matched are compared for further depth, and nodes for which it is determined there are no matches are collected as differences for said shape analysis trees.

8. A difference detection system for a three-dimensional shape model comprising:
    a tree structure generator, for preparing a graph, which includes a node for said storage of geometrical information for each path that constitutes said three-dimensional shape model and in which a geometrically adjacent relationship for said three-dimensional shape model is reflected, and for using said graph to generate tree structures in which said structure of said three-dimensional shape model is reflected; and
    a difference detector, for comparing said tree structures produced by said tree structure generator to detect differences.

9. A similar shape search system comprising:
    a similarity calculator, for entering multiple tree structures, each of which has a node that stores geometrical information for each patch that constitutes a three-dimensional shape model and in which said structure of said three-dimensional shape model, including said geometrical information, is reflected, and for comparing said tree structures to calculate said similarity of said three-dimensional shape model; and
    a search result output unit, for outputting, as a search result, one of said tree structures that is obtained by said similarity calculator and that is highly similar to a tree structure for a predetermined model that constitutes a search key.

10. The similar shape search system according to claim 9, further comprising a restrictive condition addition unit for defining a restrictive condition for the comparison of shape analysis trees, relative to said tree structure for said predetermined model that constitutes a search key,
wherein said similarity calculator compares said tree structures while taking into account said restrictive condition that is added to said tree structure of said predetermined model by said restrictive condition addition unit.

11. The similar shape search system according to claim 9, wherein said similarity calculator performs a comparison for a complete tree structure whereby a tree structure is found that fully corresponds to a tree structure in a predetermined three-dimensional shape model, which serves as a search key, and is ascertained to evidence a high similarity to said predetermined three-dimensional shape model, or performs a comparison for a sub-tree structure whereby said partial condition of a tree structure, which matches or is similar to a tree structure that serves as a search key, is ascertained to evidence a high similarity to said three-dimensional shape model.

12. A shape analysis method comprising the steps of:
generating, for each patch forming a three-dimensional shape model, a simple $3d$-shape that encloses said patch, and generating, for a shape analysis tree, a node that corresponds to said simple $3d$-shape;
generating an edge between said nodes that are thus generated and that are geometrically adjacent, so as to produce a neighbor graph; and
merging, based on a condition for first merging nodes wherein said shape of said patch is continuous, nodes in said neighbor graph that are connected by said edge, generating a new node in correlation with a new simple $3d$-shape that encloses patches included in said merged nodes, and generating a shape analysis tree wherein said new node acquired by merging is defined as a parent node and the other nodes, before being merged, are defined as child nodes.

13. A difference detection method for a three-dimensional shape model comprising the steps of:
generating tree structures, each of which includes a node that stores geometrical information for each patch that constitutes three-dimensional shape models and in each of which geometrical information for said patch is reflected; and
comparing said tree structures to detect a difference in three-dimensional shape models.

14. A similar shape search method comprising the steps of:
entering multiple tree structures, each of which has a node that stores geometrical information for each patch that constitutes a three-dimensional shape model and in which said structure of said three-dimensional shape model, including said geometrical information, is reflected, and comparing said tree structures to calculate said similarity of said three-dimensional shape model; and
outputting, as a comparison result, one of said tree structures that is obtained by said similarity calculator and that is highly similar to a tree structure for a predetermined model that constitutes a search key.

15. The similar shape search method according to claim 14, wherein, at the step of calculating said similarity, selectively performed are the steps of:
performing a comparison for a complete tree structure whereby a tree structure is found that fully corresponds to a tree structure in a predetermined three-dimensional shape model, which serves as a search key, and is ascertained to evidence a high similarity to said predetermined three-dimensional shape model; and
performing a comparison for a sub-tree structure whereby said partial condition of a tree structure, which matches or is similar to a tree structure that serves as a search key, is ascertained to evidence a high similarity to said three-dimensional shape model.

16. A shape analysis method comprising the steps of:
entering data for a model having a three-dimensional shape before and after a design is changed;
analyzing said shape of said model using a tree structure that has nodes corresponding to patches constituting said models and in which the positional relationship of said patches is reflected, so that a portion wherein there has been a design change can be automatically detected; and
outputting analyzation results for identifying said portion wherein said design has been changed.

17. The shape analysis method according to claim 16, wherein, on a display screen for displaying a three-dimensional shape model, a patch at said portion whereat said design has been changed is clearly designated, so that said portion wherein said design has been changed can be identified.

18. A storage medium on which input means of a computer stores a computer-readable program that permits said computer to perform:
a process for generating, for each patch forming a three-dimensional shape model, a simple $3d$-shape that encloses said patch, and for generating, for a shape analysis tree, a node that corresponds to said simple $3d$-shape;
a process for generating an edge between said nodes that are generated by said analysis tree node generator and that are geometrically adjacent, so as to produce a neighbor graph; and
a process for merging, based on a condition for first merging nodes wherein said shape of said patch is continuous, nodes in said neighbor graph that is are generated by said neighbor graph generator and that are connected by said edge, for generating a new node in correlation with a new simple $3d$-shape that encloses patches included in said merged nodes, and for generating a shape analysis tree wherein said new node acquired by merging is defined as a parent node and the other nodes, before being merged, are defined as child nodes.

19. A program transmission apparatus comprising:
storage means for storing a program that permits a computer to perform:
a process for generating, for each patch forming a three-dimensional shape model, a simple $3d$-shape that encloses said patch, and for generating, for a shape analysis tree, a node that corresponds to said simple $3d$-shape;
a process for generating an edge between said nodes that are generated by said analysis tree node generator and that are geometrically adjacent, so as to produce a neighbor graph; and
a process for merging, based on a condition for first merging nodes wherein said shape of said patch is continuous, nodes in said neighbor graph that is are generated by said neighbor graph generator and that are connected by said edge, for generating a new node in correlation with a new simple 3$d$-shape that encloses patches included in said merged nodes, and for generating a shape analysis tree wherein said new node acquired by merging is defined as a parent node and the other nodes, before being merged, are defined as child nodes.

20. A computer program product comprising a computer usable medium having computer readable program code means embodied therein for causing shape analysis, the computer readable program code means in said computer program product comprising computer readable program code means for causing a computer to effect the system of claim 1.

21. A computer program product comprising a computer usable medium having computer readable program code means embodied therein for causing shape analysis, the computer readable program code means in said computer program product comprising computer readable program code means for causing a computer to effect the system of claim 4.

22. A computer program product comprising a computer usable medium having computer readable program code means embodied therein for causing difference detection, the computer readable program code means in said computer program product comprising computer readable program code means for causing a computer to effect the system of claim 5.

23. A computer program product comprising a computer usable medium having computer readable program code means embodied therein for causing difference detection, the computer readable program code means in said computer program product comprising computer readable program code means for causing a computer to effect the system of claim 8.

24. A computer program product comprising a computer usable medium having computer readable program code means embodied therein for causing similar shape searching, the computer readable program code means in said computer program product comprising computer readable program code means for causing a computer to effect the system of claim 9.

25. An article of manufacture comprising a computer usable medium having computer readable program code means embodied therein for causing shape analysis, the computer readable program code means in said article of manufacture comprising computer readable program code means for causing a computer to effect the steps of claim 12.

26. An article of manufacture comprising a computer usable medium having computer readable program code means embodied therein for causing difference detection, the computer readable program code means in said article of manufacture comprising computer readable program code means for causing a computer to effect the steps of claim 13.

27. An article of manufacture comprising a computer usable medium having computer readable program code means embodied therein for causing similar shape searching, the computer readable program code means in said article of manufacture comprising computer readable program code means for causing a computer to effect the steps of claim 14.

28. An article of manufacture comprising a computer usable medium having computer readable program code means embodied therein for causing similar shape analysis, the computer readable program code means in said article of manufacture comprising computer readable program code means for causing a computer to effect the steps of claim 16.

* * * * *